United States Patent
Sigtermans et al.

(10) Patent No.: US 11,461,675 B2
(45) Date of Patent: Oct. 4, 2022

(54) METHODS OF MODELLING SYSTEMS OR PERFORMING PREDICTIVE MAINTENANCE OF SYSTEMS, SUCH AS LITHOGRAPHIC SYSTEMS AND ASSOCIATED LITHOGRAPHIC SYSTEMS

(71) Applicant: ASML NETHERLANDS B.V., Veldhoven (NL)

(72) Inventors: David Evert Song Kook Sigtermans, Veldhoven (NL); Marcel Richard André Brunt, Veldhoven (NL); Nicolaas Hendrik Frank Ploos Van Amstel, Eindhoven (NL); Errol Arthur Zalmijn, Malden (NL); Stefan Lucian Voinea, Eindhoven (NL); Gerardus Albertus Wilhelmus Sigbertus Preusting, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 599 days.

(21) Appl. No.: 16/492,670

(22) PCT Filed: Feb. 15, 2018

(86) PCT No.: PCT/EP2018/053781
§ 371 (c)(1),
(2) Date: Sep. 10, 2019

(87) PCT Pub. No.: WO2018/171982
PCT Pub. Date: Sep. 27, 2018

(65) Prior Publication Data
US 2020/0342333 A1    Oct. 29, 2020

(30) Foreign Application Priority Data
Mar. 23, 2017 (EP) .................................... 17162628

(51) Int. Cl.
G03F 7/20 (2006.01)
G06N 5/04 (2006.01)
(Continued)

(52) U.S. Cl.
CPC ............ G06N 5/04 (2013.01); G03F 7/70508 (2013.01); G03F 7/70525 (2013.01);
(Continued)

(58) Field of Classification Search
CPC ...... G06N 5/04; G06N 20/00; G03F 7/70508; G03F 7/70525; G06Q 30/0283;
(Continued)

(56) References Cited

U.S. PATENT DOCUMENTS

| 2005/0267609 A1 | 12/2005 | Van Donkelaar et al. |
| 2008/0270088 A1 | 10/2008 | Abe et al. |
| 2013/0055145 A1 | 2/2013 | Antony et al. |

FOREIGN PATENT DOCUMENTS

| CN | 102541017 | 7/2012 |
| EP | 3106998 | 12/2016 |

(Continued)

OTHER PUBLICATIONS

International Search Report and Written Opinion issued in corresponding PCT Patent Application No. PCT/EP2018/053781, dated May 23, 2018.
(Continued)

*Primary Examiner* — Mesfin T Asfaw
(74) *Attorney, Agent, or Firm* — Pillsbury Winthrop Shaw Pittman LLP

(57) ABSTRACT

A method for determining a causal relationship between events in a plurality of parameter time series, the method including: identifying a first event associated with a parameter excursion event; identifying a second event associated with a failure event, wherein there are a plurality of events
(Continued)

including the first events and second events; determining values of transfer entropy for pairs of the events to establish a causal relationship for each of the pairs of events; using the determined values of transfer entropy and identified causal relationships to determine a process network, wherein each of the events is a node in the process network, the edges between nodes being dependent upon the values of transfer entropy; identifying a directed cycle within the plurality of events and the causal relationships; classifying a directed cycle; and classifying one or more events having a causal relation to the classified directed cycle.

20 Claims, 6 Drawing Sheets

(51) Int. Cl.
*G06N 20/00* (2019.01)
*G06Q 30/02* (2012.01)
*G06F 17/18* (2006.01)

(52) U.S. Cl.
CPC ......... *G06N 20/00* (2019.01); *G06Q 30/0283* (2013.01); *G06F 17/18* (2013.01)

(58) Field of Classification Search
CPC ... G06F 17/18; G05B 23/024; G05B 23/0221; G05B 23/0283
See application file for complete search history.

(56) References Cited

FOREIGN PATENT DOCUMENTS

| WO | 2010027046 | 3/2010 |
| WO | 2017055073 | 4/2017 |

OTHER PUBLICATIONS

Duan, Ping, et al.: "Direct Causality Detection via the Transfer Entropy Approach", IEEE Transactions on Control Systems Technology, vol. 21, No. 6, Nov. 2013.

Taiwanese Notice of Allowance and Search Report issued in corresponding Taiwanese Patent Application No. 108121318, dated Jun. 10, 2020.

METHODS OF MODELLING SYSTEMS OR PERFORMING PREDICTIVE MAINTENANCE OF SYSTEMS, SUCH AS LITHOGRAPHIC SYSTEMS AND ASSOCIATED LITHOGRAPHIC SYSTEMS

CROSS-REFERENCE TO RELATED APPLICATIONS

This application is the U.S. national phase entry of PCT Patent Application No. PCT/EP2018/053781, which was filed on Feb. 15, 2018, which claims priority of European patent application no. application 17162628.6, which was filed on Mar. 23, 2017, and which is incorporated herein in its entirety by reference.

BACKGROUND

Field of the Invention

The present invention relates to predictive maintenance of systems generally and to methods for modelling such systems. More specifically, the present invention relates to systems and techniques that are used to measure, inspect, characterize, simulate and/or evaluate the performance of lithographic systems and techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

It is desirable to model operation of lithographic systems or apparatuses (or systems in general). This may comprise monitoring parameter values of the lithographic system and making predictions of future performance or events based on these parameter values using a model of the system operation. The disclosure herein describes a methods relating to such predictive maintenance of lithographic systems, or systems in general.

SUMMARY OF THE INVENTION

The invention in a first aspect provides a method for determining a causal relationship between events in a plurality of parameter time series associated with an industrial process, the method comprising: identifying at least a first event associated with a parameter excursion event and identifying at least a second event associated with a failure event, wherein there are a plurality of events comprising said first events and second events; determining values of transfer entropy for pairs of said events to establish a causal relationship for each of said pairs of events; using said determined values of transfer entropy and identified causal relationships to determine a process network, wherein each of said events is a node in said process network, the edges between nodes being dependent upon the determined values of transfer entropy; identifying one or more directed cycles within said plurality of events and said causal relationships; classifying a directed cycle based on a nominal system behavior; and classifying one or more event(s) having a causal relation to the classified directed cycle based on the cycle classification.

The invention in a second aspect provides a lithographic apparatus comprising: an illumination optical system arranged to illuminate a pattern; and a projection optical system arranged to project an image of the pattern onto a substrate; wherein the lithographic apparatus is arranged to perform the method of the first aspect to model operation of said lithographic process performed by said lithographic apparatus.

The invention yet further provides a computer program product comprising machine-readable instructions for causing a processor to perform the method of the first aspect.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Before describing embodiments of the invention in detail, it is instructive to present an example environment in which embodiments of the present invention may be implemented.

Figure 1:
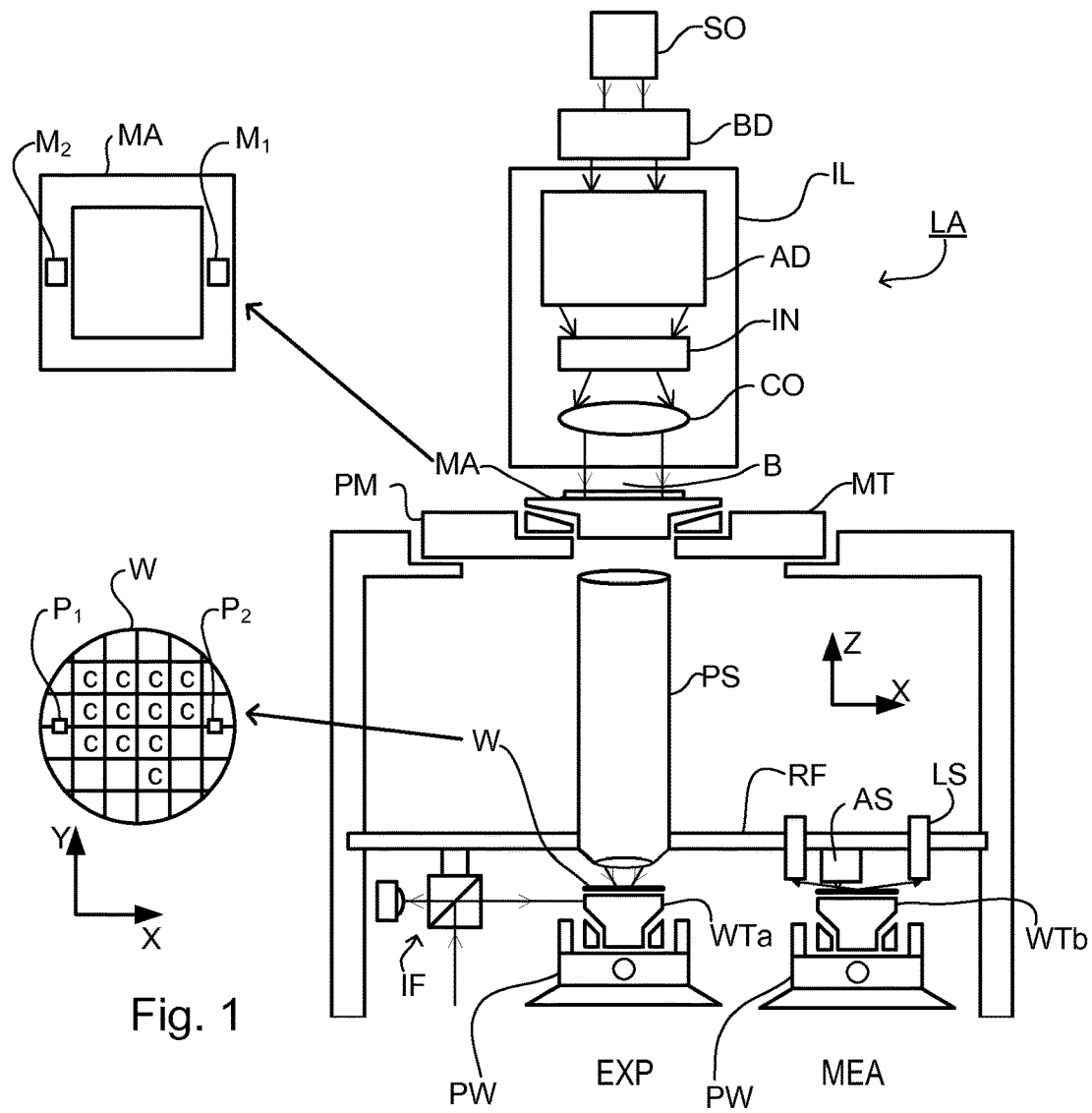
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can take many forms, The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., reticle/mask) MA with respect to the path of the radiation beam B, e.g., after mechanical retrieval from a mask library, or during a scan.

Patterning device (e.g., reticle/mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment mark may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
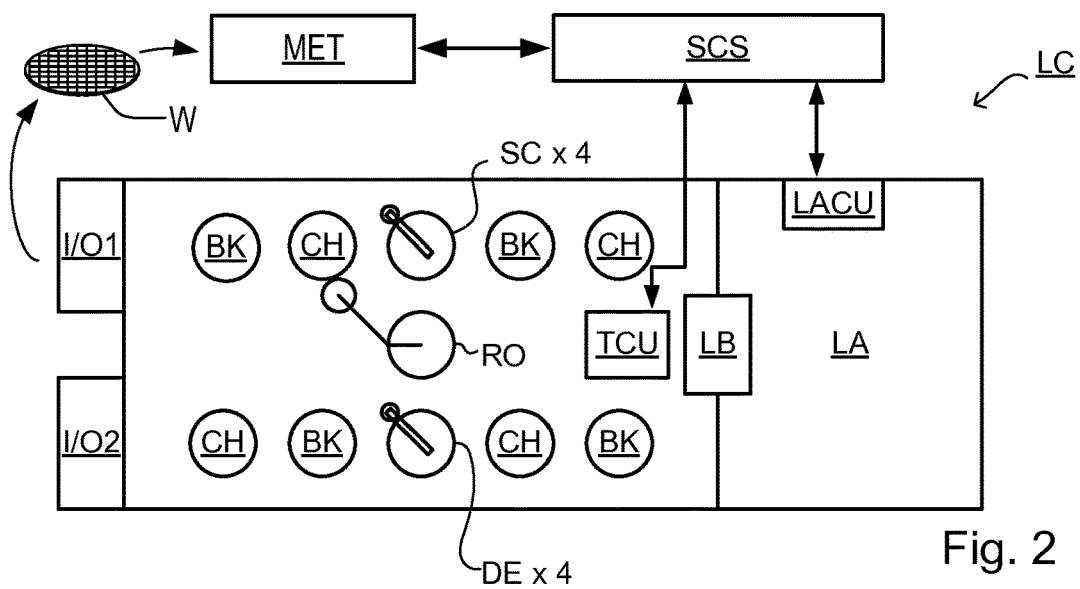
FIG. 2 depicts a lithographic cell or cluster in which an inspection apparatus according to the present invention may be used.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
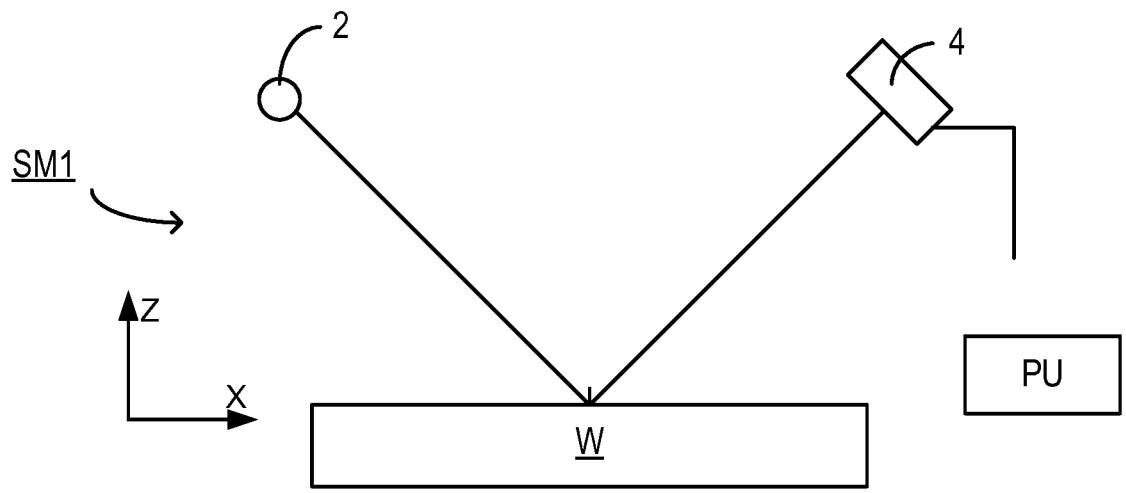
FIG. 3 illustrates the principles of operation of a spectroscopic scatterometer as an example of an inspection apparatus.
Figure 3:
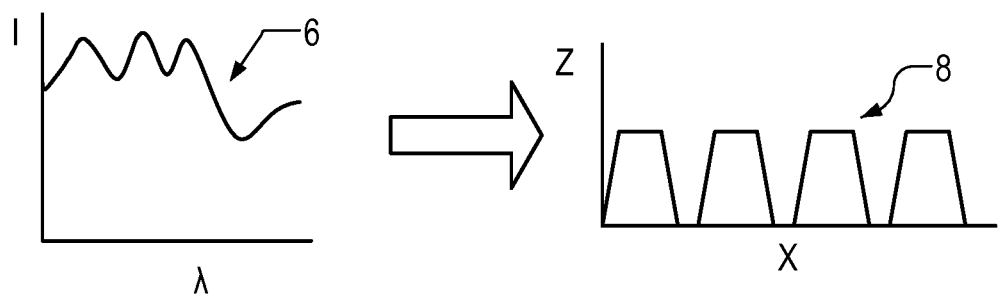

FIG. 3 depicts a known spectroscopic scatterometer which may be used as an inspection apparatus in a metrology system of the type described above. It comprises a broadband (white light) radiation projector 2 which projects radiation onto a substrate W. The reflected radiation is passed to a spectrometer 4, which measures a spectrum 6 (intensity as a function of wavelength) of the specular reflected radiation. From this data, the structure or profile 8 giving rise to the detected spectrum may be reconstructed by calculation within processing unit PU. The reconstruction can be performed for example by Rigorous Coupled Wave Analysis and non-linear regression, or comparison with a library of pre-measured spectra or pre-computed simulated spectra. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Computer modeling techniques may be used to predict, correct, optimize and/or verify performance of a system. Such techniques may monitor one or more parameter values and predict, correct, optimize and/or verify system performance based on these parameter values. The computer model may be constructed using historical parameter values, and may be constantly updated, improved or monitored by comparing predictions of parameter values to the actual values for the same parameters. In particular, such computer modelling techniques may be used to predict, correct, optimize and/or verify system performance of a lithography system or process.

At present, significant effort is expended on the creation of predictive models, and more specifically predictive models which predict failures. Methodologies, which may for example include statistical process control approaches, machine learning approaches and data mining approaches, can be employed to create predictive models which can predict machine failure and generate alerts before failure occurs. Some of the methods used are Bayesian inference, Neural networks, Support Vector Machines etc.

The current methods have several drawbacks: in general business and/or domain knowledge is needed, either to optimize the models or to define suitable transformations of data. In other words, machine learning requires (continuous) input from domain experts. For expensive repairs (in terms of part cost, labor, downtime etc.) a double check on the alert is needed to minimize the cost of a false positive. This "alert validation" needs to be created again by domain experts. These alert validations are not generated by the model algorithms. Another drawback is that in principle a model is created per issue, leading to large lead times when more than one model needs to be created.

A lithographic apparatus can be thought of as a complex distributed processing system comprising many subsystems. The lithographic apparatus typically generates an event log, amongst other data sources. This event log is generated by each subsystem of the lithographic system, and is a record of lithographic apparatus events. Exception linking, which is the mechanism which links recorded events, does not enable causal relationship (cause and effect) to be traced; it simply clusters recorded events that essentially describe the same observable root exception (root cause). The event log does not indicate repair strategies nor solutions and design improvements. Event log data also lacks synchronization; the clocks of different subsystems are not necessarily synchronized. As a result, exception linking is not normally more than 50% accurate in detecting root exceptions.

Diagnostic time may be effectively minimized through reutilizing solutions which have solved previous failures. However, to efficiently solve unprecedented failures or learn from past events to improve future designs, the event log lacks an embedded causal structure to reliably identify event-to-failure paths. Information describing (fault) event evolution and propagation paths is also important for the development of scanner prognostic models, which are now primarily based on expert knowledge that only relates known causal relationships between predictive observables (notably performance parameters). This leaves an unknown collection of potentially predictive, and possibly coupled, observables unexplored.

It is proposed herein, that a lithographic apparatus can be described in terms of a network of driving and responding observables (i.e., cause and effect relationships), specifically "extreme events" (parameter excursion events or irregularities in input data) and failure events (e.g. machine errors, part swaps, calibrations etc.).

It is proposed that the concept of transfer entropy can be used to determine causal relationships between pairs of these events. However, this methodology can also be combined with other existing modelling approaches. This enables a causal mapping of the network to be performed, from which extreme event to failure event paths and root causes can be determined. It has been observed that, for a calibrated electromechanical system, the following six "extreme" events in data may be an indication of imminent failures: spikes, steps, changes in trend, changes in standard deviation, changes in standard deviations relative to trend and control limit violations. The level of extremity of these events may be indicated on a continuous or digital scale (e.g., 0→no spike, 1→small spike, 2, large spike etc.).

The causal network may consist of nodes and directed edges (links). The nodes indicate the extreme data events and failure events. The directed edges indicate the direction of causality, and may be labeled with the causal delay (i.e. time differences between cause and effect) and conditional probability. Every edge leading from an extreme data event to a failure event can be considered to be a predictive model.

Figure 4:
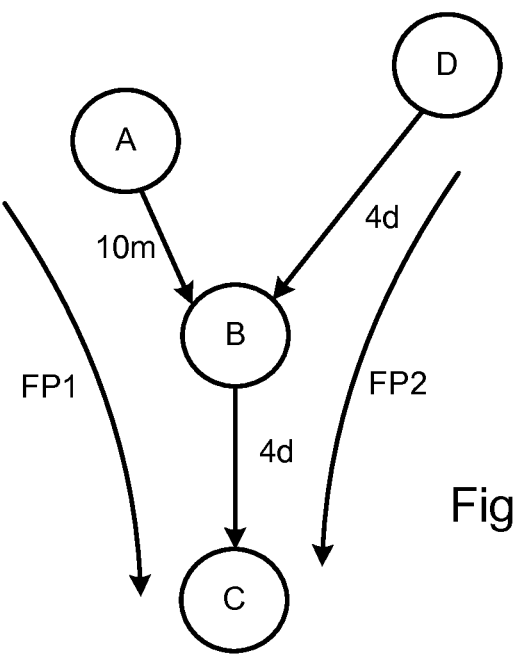
FIG. 4 shows an example process network obtainable using a method of the invention.

FIG. 4 shows a simple causal directed graph comprising four nodes: three extreme data event nodes A, B, D and a failure event node C. Each directed edge is labeled by the causal delay: 10 minutes between nodes A and B, 4 days between nodes D and B and 4 days between nodes B and C. Arrows FP1 and FP2 indicate the two different failure paths leading to failure event C. The causal directed graph teaches that: should extreme data event D be observed followed 4 days later by extreme data event B, or extreme data event A be observed followed 10 minutes later by extreme data event B, failure event C can be expected to happen 4 days after extreme data event B was observed. Extreme data event B can be considered to be an alert validation of extreme data event A or D, depending on the failure path FP1 or FP2 observed.

Figure 5:
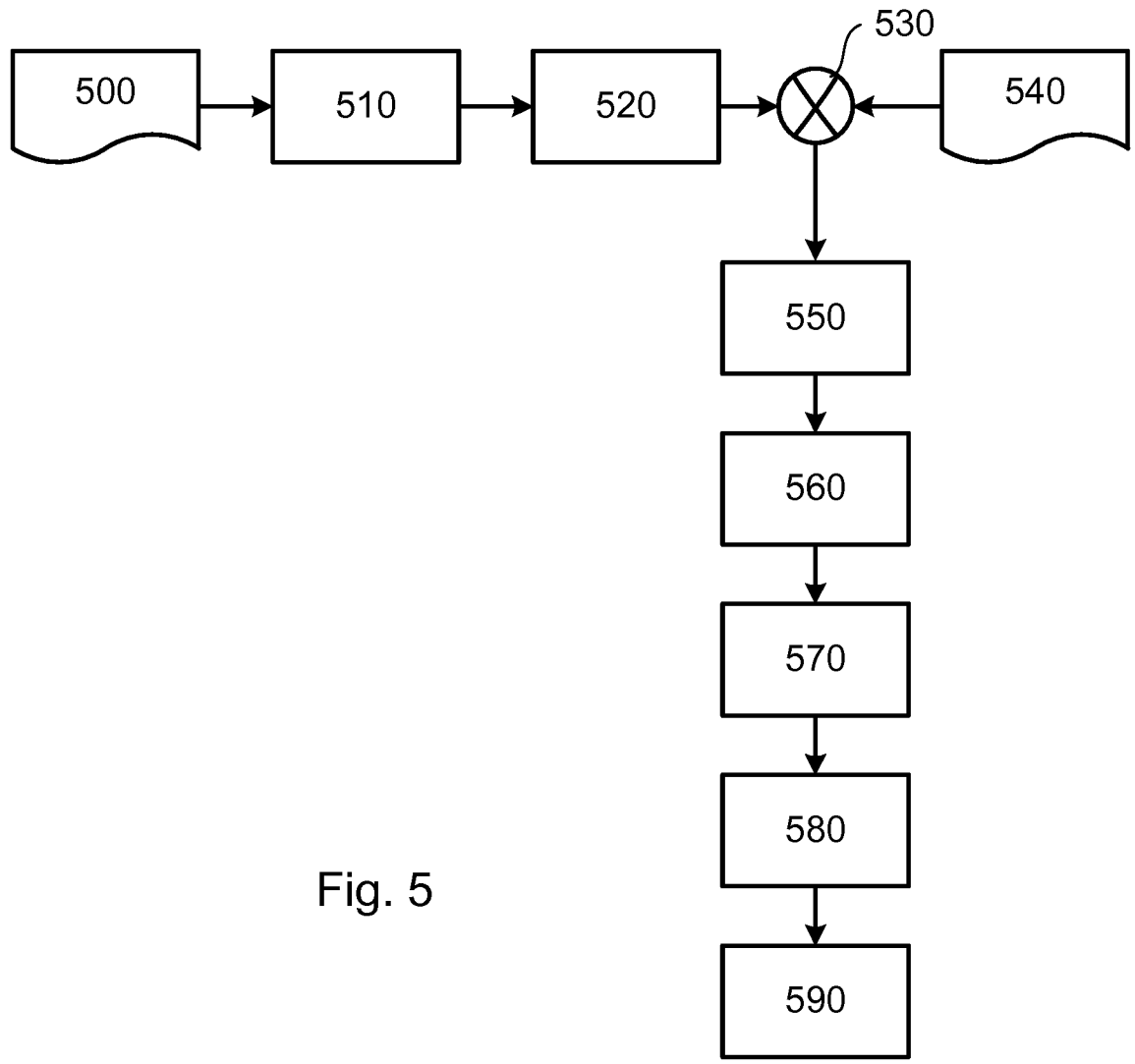
FIG. 5 is a flow diagram illustrating a method for determining a causal relationship between events according to an exemplary embodiment of the invention.

Transfer entropy enables the inference of a causal network of observables, through computation of information transfer in bits, between any pair of simultaneously observed, possibly coupled, time series. The time series may come from, for example, event log data, performance parameters, board dumps, test data, metrology data or trace data. The resulting transfer entropy is able to distinguish driving and responding observables (events) and detect time-asymmetry in their interactions. Being a non-parametric measure, capable of identifying arbitrary linear and non-linear causal effects without the need of a model, transfer entropy can effectively gain a better understanding of the underlying dynamics of the lithographic apparatus. This will aid accurate failure diagnosis and prognosis, as well as structural design improvements. This can be achieved through:

reconstruction of lithographic apparatus causal connectivity from observed time series relating to extreme events and failure events;
 creation of simultaneous multiple models;
 analysis of failure evolution and different failure paths;

identification of root causes for failures;
analysis of performance degradation;
analysis of lithographic apparatus control performance;

FIG. 5 is a flowchart showing a method using the transfer entropy formalism as described.

Machine time series 500 are optionally context filtered at step 510. In a lithographic apparatus, the context or state, refers to the mode or operational state that the apparatus is in when a parameter value is recorded. Less formally, it is a measure of what the machine is doing when the parameter value is recorded. Different contexts may include, for example: "up", "production", "idle", "scheduled down", "unscheduled down". Normally, it is possible to determine the context from parameter values of the parameters being monitored. To do this, the predictive model may comprise or use a context engine to determine parameter data context from the parameter data. However, at certain times, determination of context from the parameter data becomes more difficult. In particular, this may be the case during a context transition; that is when the lithographic apparatus transitions from one operational state to another operational state. However, this will not necessarily be the case for all transitions. Should the context engine make an error in determining the context, the model output accuracy may be compromised. Normally, the context engine assumes that each transition between contexts is instantaneous. However, the reality is that each transition takes a finite time, and during the transition, context determination may be less accurate.

Context filtering therefore uses a priori knowledge of context determination accuracy for all contexts to determine a quality weighting for the context determination. This quality weighting may be determined per segment of a context. Each context may be segmented into context segments. This segmentation may segment each context into transitional segments and intermediate segments. More specifically, the transitional segments may comprise a beginning segment and an end segment. In an embodiment, the transitional segments may be relatively short compared to the intermediate segment. It may also be that one or more contexts are segmented into fewer or more than three segments, as is appropriate.

More explanation of context filtering, with specific timing diagrams and system examples, is described below under the heading "Context Filtering".

At step 520, extreme data events are identified from the context filtered time series. In an embodiment, up to six different types of events in the data may be considered an indication of imminent failures. These extreme events may comprise one or more of: spikes, steps, changes in trend, changes in standard deviation, changes in standard deviations relative to trend and control limit violations. Therefore identifying an extreme event may comprise identifying one or more of these events in the input time series 500. In an initial conditioning step, the input parameter time series may be transformed into "extreme event time series" comprising, for example, binary data streams indicating the presence or otherwise of an extreme event (e.g., 0=no extreme event, 1=extreme event). More levels (or a continuous scale) are possible to capture degrees of extremity (e.g., 0=no extreme event, 1=minor extreme event, 2=major extreme event).

The context filtering may result in a phase delay and therefore the time of each event may be determined according to the methodology described in the subsequent section entitled "Determining the Time of an Event Indicator in Parameter Data".

In the case of a step (e.g., a persistent change in a monitored parameter value) event indicator, it may be determined whether there is an increase in process capability subsequent to the step. If so, the step may be attributed to a maintenance action rather than being considered an indicator of an extreme event. Process capability is a measure of the ability of a process to produce output within at least one process limit, specification or other requirement. Process capability may be expressed in terms of process capability index (e.g., $C_{pk}$ or $C_{pm}$) or as a process performance index (e.g., $P_{pk}$ or $P_{pm}$).

At step 530, additional time series 540 comprising failure events are added to the (context filtered) time series 500 for which any extreme events present have been identified. The matching of records from the different data sources (the time series comprising extreme events and the time series comprising failure events) may be combined and matched according to the methodology described in the subsequent section entitled "Data Record Matching". This describes matching the records (extreme events and failure events) from the plurality of data sources (The time series 500 and 540) which have variation between them in the matching quality of their data. For example, some of the extreme events will be obtained from time series of (for example) millisecond precision (e.g., the parameter is sampled every millisecond); other parameters will be sampled only every second, or only every hour or day. The method comprises repeatedly matching and filtering records from the data sources to obtain matched records using successively less strict matching rules, the matching rules being defined based on the variation in the matching quality. More specifically, this step may comprise minimizing the entropy (e.g., minimizing the distances between entries) between the two data sources.

At step 550, depending on the number of failures and the inherent model validation approach chosen (standard in machine learning), causal networks are created based on, for example, a subset and mix of low quality and high quality data. This data may be input for a transfer entropy algorithm, the output of which being used to create the causal network. Each extreme data event node leading to a failure event node (direct or indirect) can be seen as a predictive model. It should be appreciated that all functional, possibly multivariate and nonlinear information regarding the relationship is translated in the edge parameters (direction, causal delay, transition probability). Transfer Entropy, and its application to lithographic systems is described in greater detail below, under the heading "Identifying Causal Relationships using Transfer Entropy".

At optional step 560, automated model qualification is performed. This may comprise performing per-edge backend testing. All the information required to perform the backend testing is available in the generated data set: the backend testing and thus initial model qualification can also be automated. Backend testing may be an important part of model building and maintenance. Backend testing comprises applying the model on historic data for which outcomes are known, and comparing the known outcomes to the model's predictions for those outcomes. In this way the accuracy of the model's predictions can be verified. Also, the model parameters may be altered to minimize the difference between the modelled outcomes and actual outcomes when the model is run again. An output of backend testing may be a confusion matrix (or error matrix) and related model characteristics (for example: precision and/or sensitivity).

The results of the backend testing can then be used to determine a benefit metric, (e.g., a probability density function (PDF)). The benefit metric may quantify the benefit of attending to an extreme data event (or, in a more specific example, an alert generated as a consequence of a detected extreme data event) as a function of the causal delay. This PDF can be used in determining a dynamic alert prioritization, as will be subsequently described. Such a benefit metric may take the form of underlying probability distributions for the predicted failure events. Based on the benefit metric and a cost metric obtained from known business information, it is possible to evaluate the expected benefit against cost in attending to each alert as a function of time. In a specific example, the underlying failure probabilities may be approximated by way of a Weibull approximation. Further details of the generation of a benefit metric and how it can be used in the management of alerts is described in the subsequent section "Methods of managing alerts".

Figure 6:
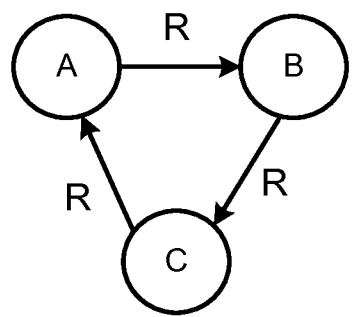
FIG. 6 is a schematic representation of a directed cycle.

At optional step 570, it may be that "directed cycles" emerge in the network, which lead to a failure event. Where such directed cycles are determined, the root cause event leading to the cycle can also be detected. This information can be used to minimize the effort needed to investigate the cause of a failure. Directed cycles indicate an intransitivity between nodes. FIG. 6 illustrates such intransitivity. It shows three nodes A, B and C related by edges describing a relationship R, such that node A is dependent upon node B (A R C), node B is dependent upon node C (B R C) and node C is dependent upon node A (C R A). This implies that relationship R is intransitive within the context of the cycle. Such intransitivity can be either wanted or unwanted. However, the inventors believe that root causes are not intransitive in nature. Consequently, such a method may be used to exclude a large numbers of potential root causes and therefore more quickly and efficiently identify the actual root cause.

A directed cycle in a directed graph (i.e., the causal network generated at step 550) implies that the relation under consideration can be intransitive within the context of the directed cycle (at least). From the perspective of causality this might seem counter-intuitive: causality tends to be transitive. However, in causal reasoning, causal intransitivity is known and referred to as causal homeostasis. Causal homeostasis may describe, for example, an interlocking set of causes and effects which result in a set of properties that endure together as a stable set (or reinforcing mechanism) over time. This form of causality is used to describe certain features in complex (for example biological) systems.

The fact that intransitive unwanted directed cycles may be observed, but that root causes are not intransitive, means that potential root causes may be determined as unwanted nodes which are connected with an unwanted directed cycle, but does not form part of the unwanted directed cycle. Therefore, all nodes within the unwanted directed cycle can be dismissed as potential root causes. Of course, some directed cycles will be wanted (e.g., planned and/or desirable feedback or reinforcing mechanisms).

However, it should be appreciated that, for whatever reason, the root cause node is not present on the graph and that the unwanted directed cycle has no connected nodes (on the graph) which are not part of the cycle. In this case, the most important node in the cycle can be presumed to be the root cause node. While such a node will not actually be the root cause (being intransitive), it will help identify the actual root cause in subsequent analysis. Relative importance of nodes may be defined in different ways, the method can depend on the scope and context of the application. For example, a centrality analysis may be used to determine the most important node. Any suitable centrality metric or method can be employed.

Step 570 may comprise the following main stages—1) determine any directed cycles, 2) determine whether the directed cycles are wanted and 3) determine root cause. The concepts involved in each of these main stages is expanded upon in the subsequent section "Root Cause Determination via Directed Cycles".

At optional step 580, different failure paths can be determined. This information can be used to optimize reactive diagnostics strategies. Also, subsequent nodes on a failure path can be seen as validation of the previous "extreme events".

At step 590, the models which satisfy one or more quality criteria (in terms of one or more of sensitivity, precision, causal delays etc.) following the model qualification step are deployed in combination with an associated dynamic priority metric and/or expiry time, which may be determined as described in the aforementioned "Methods of managing alerts" section, below.

Consequently, in addition to creating predictive models, the method can help identify a root cause of a failure (when unwanted cycles are identified), different failure mechanisms and suggestions for alert validations.

Context Filtering

When modelling lithographic apparatuses, it has been shown that inherent defects in the context information may result in erroneous model input data, which in turn may result in erroneous model output (for example, false positives). It has been further shown that a very significant number of false positives occur as a result of issues with context determination.

A priori analysis may be used to determine a measure of the accuracy of a context determination for each context segment; that is for every segment of every context. This may comprise a measure of the probability that a context determination for each context segment will be correct. The quality weighting may be derived from this accuracy measure. It may be that the quality weighting will be lower for transitional segments relative to intermediate segments. However, this will not necessarily be the case, and the quality weighting assigned to a particular segment will depend on the a priori analysis and therefore the actual context and segment of that context.

In an embodiment, a database or file of quality weightings will be determined, one for each of the possible context segments a system (e.g., lithographic apparatus) may be in. For example, the beginning, intermediate and end segments of an "idle state" context may each be assigned a quality weighting. Similarly, each segment of a "production state" context may each be assigned a quality weighting. This can be done for each context.

It should be appreciated that the accuracy measure, and therefore quality weighting, may also depend on the actual context transition. The context transition describes which context the system is transitioning from and which context it is transitioning to. Specifically, the accuracy measure may be dependent, not only on which context segment the system is operating in, but also the preceding and/or succeeding context segment. By way of specific example, the quality measure applicable for the end segment of "production state" context may be dependent on the succeeding context, for example, the quality measure may be different if this succeeding context is "scheduled down" or "unscheduled down". As a consequence, in an embodiment, quality weighting may be determined for each context segment, per context transition. This means that quality weighting may be determined for each context segment in dependence of the context segment immediately preceding it or the context segment immediately succeeding it. Therefore, by way of specific example, a different quality weight may be determined for the end segment of "idle state" context, for each possible succeeding state. Similarly, a different quality weight may be determined for the beginning segment of "idle state" context, for each possible preceding state.

Once this database has been determined, it can be used to assign quality weighting to parameter output depending on the context determination. The quality weighting can then be used as a model input. In an embodiment, this quality weighting may be binary (1 or 0), such that parameter data corresponding to segments with an acceptable quality weighting (e.g., a quality weighting above a threshold) are given normal consideration and parameter data corresponding to segments with an unacceptable quality weighting (e.g., a quality weighting below a threshold) are ignored. In such an embodiment, it may be that intermediate segments are always weighted "1". However, other weighting schemes are possible; such weighting schemes may have different resolution (not necessarily binary). For example, the weighting may be such that some parameter data may be given a level of consideration which varies depending upon the quality weighting assigned to the segment corresponding to the parameter data.

Figure 7:
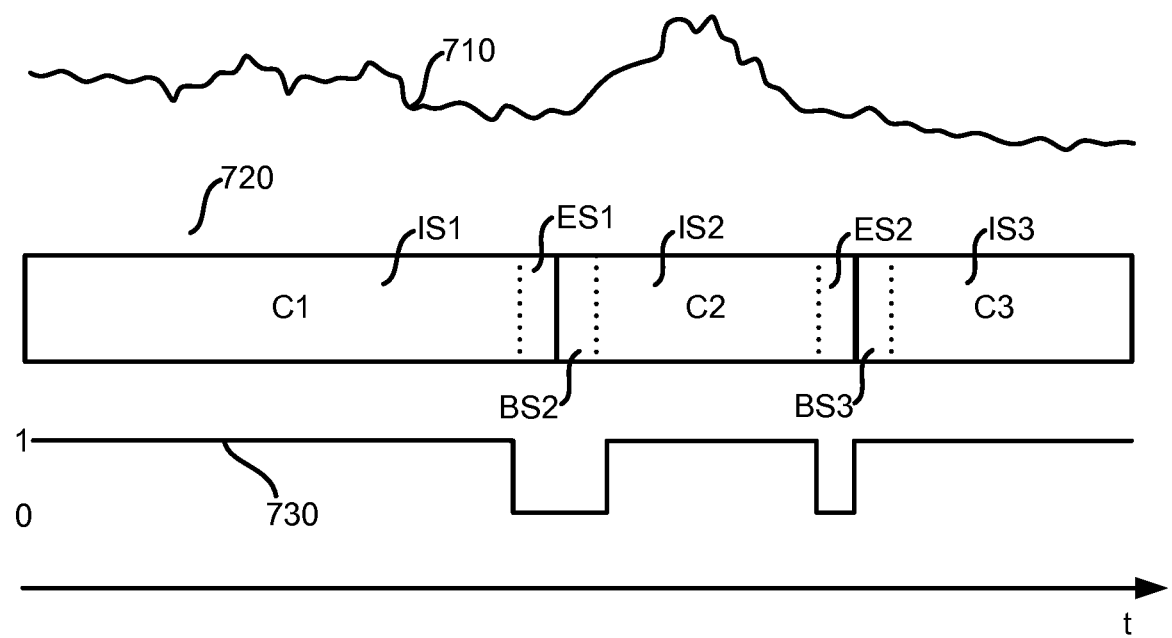
FIG. 7 is a timing diagram illustrating a method of assigning quality weights to parameter output depending on context determination.

FIG. 7 is a timing diagram illustrating a context filtering method such as that performed at step 510 of FIG. 5 according to an exemplary embodiment. Shown is a time axis t, and trace for a parameter output 610. Below this is the lithographic apparatus context engine output 720 illustrating the context assigned to the parameter data. In this example, a first portion of the output is assigned context C1, a second portion of the output is assigned context C2, and a third portion of the output is assigned context C3. Each of these contexts has been segmented into segments. Only a latter part of first context C1 and an initial part of context C3 is shown. Consequently, the timeframe illustrated shows the intermediate segment IS1 and end segment ES1 of context C1, the beginning segment BS2 intermediate segment IS2 and end segment ES2 of context C2 and the beginning segment BS3 and intermediate segment IS3 of context C3. Trace 730 shows the output of the quality weighting. As can be seen this output is at "1" for segment IS1, but falls to "0" during the transition segments ES1 and BS2. This may be because it has been determined beforehand that the parameter output data 710 during end segments of context C1 and beginning segments of context C2 are not reliable. The fact that the context transition is from context C1 to context C2 may or may not be taken into account. The quality weighting output 730 is again "1" during intermediate segment IS2, and falls again to "0" for transition segment ES2. It can be seen, however, that the quality weighting output 730 is "1" during transition segment BS3 indicating that it has been evaluated that parameter data during the beginning segment of context C3 is of acceptable quality. The quality weighting output 730 remains at "1" during segment IS3.

Figure 8:
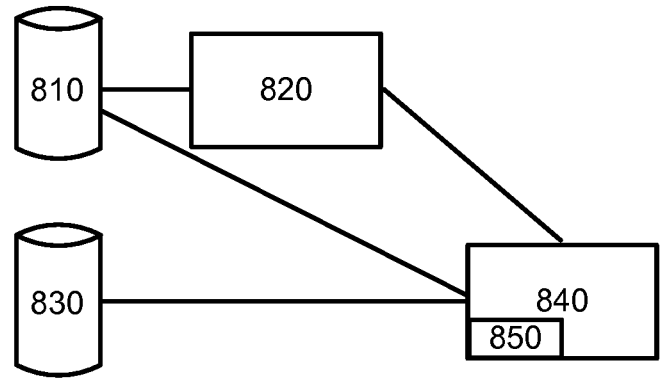
FIG. 8 is a system diagram illustrating a system operable to assign quality weighting to parameter data.

FIG. 8 is a system diagram illustrating a system operable to assign quality weighting to parameter data, according to a context filtering method. Context data 810 is used to derive a quality weight ruleset 820. The quality weight ruleset 820, context data 810 and model input data (e.g., parameter data from sensor output) 830 are used as inputs to a predictive model 840, which comprises a context engine 850. The predictive model will use the quality weight ruleset 820 to assign quality weighting to the model input data 830 depending on the output of the context engine 850.

Determining the Time of an Event Indicator in Parameter Data

Event indicators in parameter data output from sensors, such as steps, spikes, any of those described in the description of step 520, can indicate a number of events. In particular the events may comprise extreme events and failure events. To be able to correlate event indicators in the parameter data, it is important to determine the time of the occurrence of the event indicator with sufficient accuracy. If this cannot be done, it is not possible to determine whether the event indicated by the event indicator is a consequence or a cause of any actions performed on the machine (e.g., a maintenance action).

Therefore, methods are disclosed to identify event indicators, such as steps and/or spikes, in parameter data and to provide an accurate estimate of the time that the corresponding event occurred The filtering of parameter data (input time series) often results in a phase delay, which causes an inaccuracy in any determination of a time for an event indicator, and therefore the time of an extreme event or failure event. To mitigate this, it is proposed that the parameter data time series is also reversed in time and the same filter applied (anti-causal filtering). These two filtered time series can then be combined to find the time of any event indicators within the time series. The effect of the anti-causal filtering is to cancel the effect of the phase delay; the two time series, filtered causally and anti-causally, will have a phase delay of equal magnitude but opposite sign. Therefore an appropriate combination of these time series (e.g., an average) will cancel the phase delay.

Figure 9:
FIG. 9 is a flow diagram illustrating a method of attributing a time to an event within a time series of parameter data

FIG. 9 is a flow diagram illustrating a method of attributing a time to an event indicator within a time series of parameter data. Such a method may be used in step 520 of the method depicted in FIG. 5 according to an exemplary embodiment. The steps are as follows, and are then described in greater detail thereafter (the order of some steps may be switched):

910—Obtain input parameter data from sensor;
920—Determine signal envelope of input parameter data;
930-Differentiate data envelopes;
940—Filter data envelope causally and anti-causally;
950—Determine time of spikes in the differentiated envelopes; and
960—Combine the determined times of the spikes from the causally and anti-causally filtered data envelopes to determine a corrected time of the event.

At step 910, parameter data is obtained from the sensor, and at step 920, the signal envelope of the parameter data is determined. This will provide an enhanced contrast of the event indicators, such as steps, with respect to signal noise. Both the upper and lower envelope may be separately determined in this step, and separately processed in the subsequent steps.

At step 930, the determined envelope (time series parameter data) is differentiated to obtain differentiated time series data. This differentiation produces spikes which indicate an event having occurred. Steps in the original time series parameter data, following differentiation, will produce single spikes. Spikes in the original time series parameter data, following differentiation, will produce pairs of positive and negative spikes.

At step 940, the differentiated time series data is filtered both causally and anti-causally to obtain first filtered time series data and second filtered time series data. Filtering anti-causally comprises reversing the envelope time series in time and applying the same filter as that applied to the forward time series. The filtering may comprise low pass filtering for the removal of differentiation noise.

At step 950, a first time of a first spike (corresponding to a step in the original parameter data) is determined for the first differentiated time series data and a second time of a second spike (corresponding to the same step in the original parameter data) is determined for the second differentiated time series data. Step 950 may also comprise identifying spikes which form one of a pair of negative and positive spikes, and therefore correspond to spikes in the original parameter data. These can then be removed or ignored, e.g., when only steps are considered to be event indicators.

At step 960, the first time and the second time are combined to determine a corrected time, the corrected time being the actual time for the event, corrected for the phase delay caused by filtering. The corrected time, for example, may be an average of the first time and the second time.

If the corrected time of an event indicator, as determined, coincides with a known maintenance action, it might be that this can be construed as not indicating a change in the system health, depending on the type of issue. A method for determining a maintenance action is disclosed above and could be used here. Otherwise the event indicators might be symptoms of an event indicating a deteriorating system health. As such, an alert may be generated, or any other action initiated, as appropriate.

Data Record Matching

Figure 10:
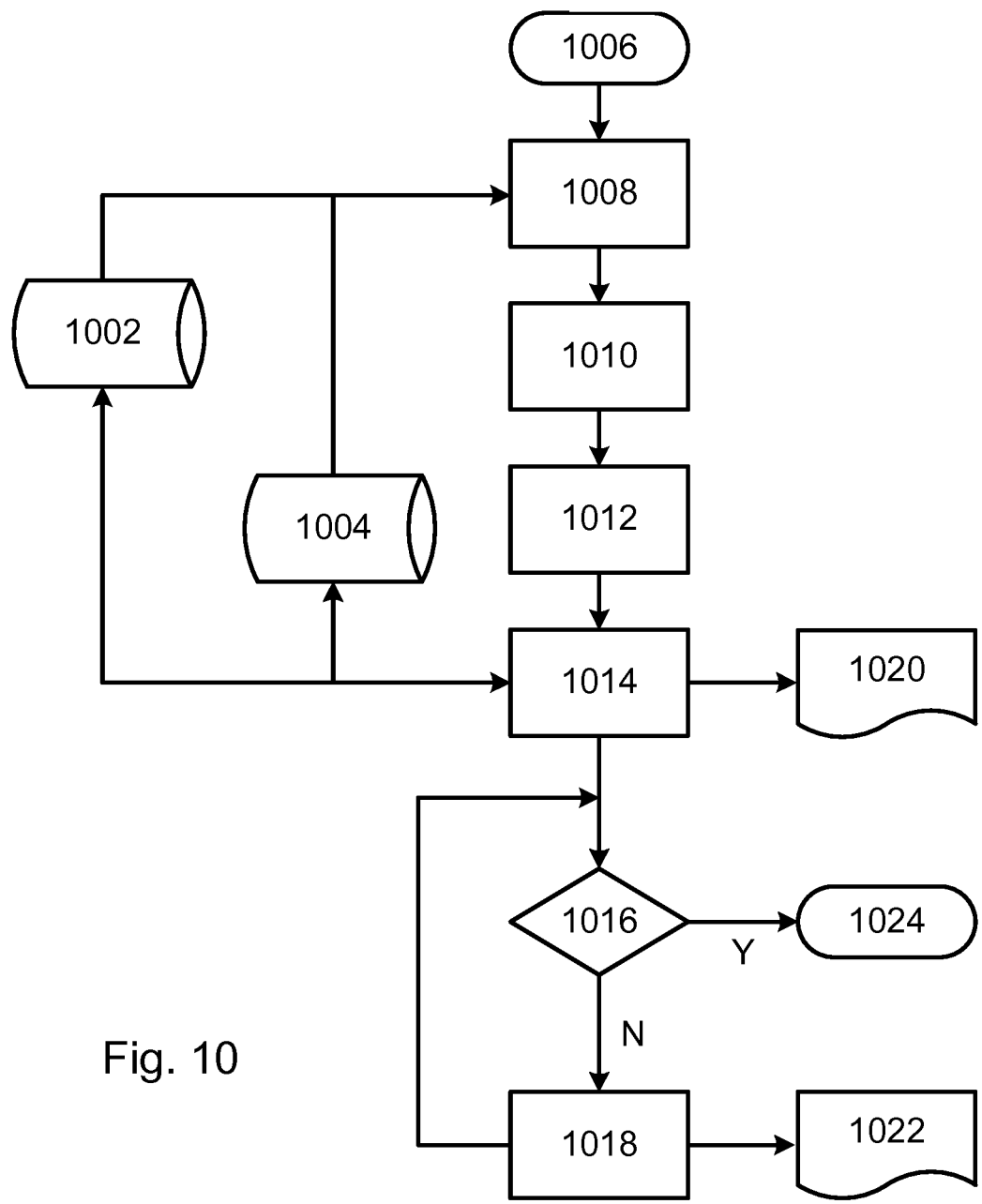
FIG. 10 is a flow diagram illustrating a method of illustrating a method of matching records have variation between them in matching quality of their data.

FIG. 10 is a flow diagram illustrating a method of matching records which may be used in step 530 of the method depicted in FIG. 5 according to an exemplary embodiment.

A plurality of data sources 1002 and 1004 have variation between them in matching quality of their data. The variation between the data sources in matching quality may comprise a difference between the data sources in accuracy or scope of their data. In this example one data source 1002 has a first data accuracy and/or scope and another data source 1004 has a second, different, data accuracy and/or scope.

The method starts at step 1006. Step 1008 involves selecting a set of fields from the plurality of data sources 1002, 1004.

Step 1010 involves defining one or more distance measures between the fields. The distance measures are related to the variation in the matching quality.

Step 1012 involves defining a set of matching rules with differing strictness based on the defined distance measures. The matching rules are thus defined based on the variation in the matching quality.

The matching rules reflect the variation and differences in data entry processes and data scope. For example: certain event data is generated via software within millisecond accuracy, where other, related service data, is entered manually with potential delays of days. A progressively relaxed matching rule for "event occurrence date/time" could be an increasing difference in supposed "event occurrence date/time" between the different data sources.

The strictest matching rule may be an exact match i.e. specific data entries are identical, between data sources under consideration. In the case of strictest matching rule all matched data may be classified as belonging to the highest data quality tier (TIER1). The higher the data quality the lower the uncertainty about all aspects of the event. For this TIER1 data it is possible to qualify the business aspects (e.g. part cost, labor hours), machine aspects (downtime, root error or error pattern, downtime, number of related interrupts) and organizational aspects (time spent on certain activities during the down; differences in issue resolution depending on location etc.) with a high degree of accuracy.

The least strict matching rule is that no match can be found between data from different data sources. This means that for these issues only business aspect or only performance aspects or only organizational aspects are known. The lower the data quality, the higher the uncertainty about the event.

Matching rules may be "distance" measures between fields of different data sources. Between fields, distance measures can be defined.

For example, for date/times one could use the actual minimum of the difference between the date/times in a management information system and the end of the down (in a manufacturing system event log).

For root errors (e.g. error codes associated with an apparatus failure) the distance measure may be defined as the inverse of the relative frequency of these root errors for certain groups of Service Orders (SO's) with common features like part usage, or failure description. Per part a list of all possible root errors that were ever recorded on that part can be created, plus their relative frequency. In case of an exact match between two data sets (i.e. they had the same root error) the "distance" can be defined as 0; otherwise the inverse of the relative frequency can be used.

Many other distance measures could be utilized for these two examples. Matching rules may be created by subject matter experts and reflect the idiosyncrasies of the data sources under consideration.

Examples of distance measures (where SO=Service Order and PMA=Preventive Maintenance Action, RER=Root Error Report, SAP=software system from SAP SE) are:

1. Root error distance between machine generated data (source=PMA) and Service Order information with part used (manual, source is SAP).
   a. If root error code in PMA=root error code in SAP: RER distance between the sources=0.
   b. If root error code in PMA "is in list" of RER's of SO's with parts used, distance=1/(relative frequency)−1.
      i. Per part, all RER's ever written by engineers on that specific part are counted. Based on this, the relative frequency can be calculated.
2. Time distance between two time fields:
   a. Distance (e.g. unit is arbitrary)=Difference in time between the two fields.
3. Number of parts distance: when a match can be found with certain SO's, the number of parts itself is used as a distance measure (the idea about distance: the larger the distance, the higher the uncertainty).
4. Source distance: each source can a priori be classified as being highly accurate or less accurate. Like the number of parts, this may be an absolute distance. Thus the sources may be ranked with respect to accuracy of the selected fields.

The matching rules are defined based on a distance measure between fields in different data sources. The matching rules may be defined based on a weighted sum of the distance measure. The distance measure may for example comprise:

A difference in time between fields in different data sources.

A difference between manually-generated data in a data source and machine-generated data in another data source.

A difference in number of equipment parts between fields in different data sources.

A difference in the inverse of the relative frequency of occurrence of error identifiers between fields in different data sources.

A difference in data-source accuracy between different data sources.

The method may also include transforming at least some of the data, before the matching steps, for example at step 1008. Depending on the data type (date/time, text) specific transformation techniques can be used (e.g. for text certain text mining techniques may be employed).

Table 1 below shows an example set of matching rules.

TABLE 1

Example Matching rules

| Order of rule | Machine number | Date/Timestamp match | Error code match | Other match | Tier |
|---|---|---|---|---|---|
| 1 | Identical | | | Source = apparatus downtime report | TIER1 |
| 2 | Identical | SO timestamp matches with PMA interrupt timestamp (+/−30 minutes) | PMA error code identical to SO error code | 3 or fewer different parts on same SO | TIER1 |
| 3 | Identical | SO timestamp matches with PMA interrupt timestamp (+/−30 minutes) | PMA error code in list of "root errors per part", probability >=25% | 3 or fewer different parts on same SO | TIER2 |
| 4 | Identical | PMA interrupt timestamp in SO date (+/−3 days) | PMA error code identical to SO error code | 3 or fewer different parts on same SO | TIER2 |
| 5 | Identical | PMA interrupt timestamp in SO date (+/−3 days) | PMA error code identical to SO error code | More than 3 different parts on same SO | TIER3 |
| 6 | Identical | PMA interrupt timestamp in SO date (+/−3 days) | | Submodule identical | TIER4 |

Steps 1014-1018 involve matching records from the data sources 1002, 1004, by repeatedly matching and filtering records from the data sources to obtain matched records 1020, 1022 using successively less strict matching rules for unmatched records of a preceding match This involves querying 1014 the data sources using the strictest of the set of matching rules and associating matched records thereby obtained 1020 with an indicator indicating the high matching quality. It also involves querying 1018 the data sources using a less strict rule of the set of matching rules and associating matched records thereby obtained with an indicator indicating a lower matching quality. The repeating finishes 1016, 1024 when all the rules are used, or earlier if desired.

Thus the matched records 1020, 1022 are associated with a matching quality indicator corresponding to the strictness of the matching rule used to obtain them.

Thus, data is combined from different data sources using progressively relaxed "matching rules" for a preselected set of fields. For the data that does not match the strictest matching rules, i.e. the resulting match does not have the lowest associated uncertainty, progressively less strict matching rules are used. In other words an "algorithmic sieve" is used that both matches the available data sources and qualifies the match, for example by applying business specific knowledge.

The quality classification (TIER1 . . . TIERn) may be based on a weighted sum of the "distances". The definition of the quality classification may be the result of a decision process by subject matter experts and could vary from over time and per company.

In defining the rules it may be that they are collectively exhaustive i.e. all records from all sources are classified (and where possible linked). It has been found however that the matching rules do not need to be mutually exclusive. For example, a labor action can be related to several machine events that occurred on different times. Depending on the TIER definition these events could link to the same SO, but with different matching quality. Depending on the purpose of the analysis the required minimal matching quality will be different.

This "sieve" is expensive, in terms of computing time, as all records in the data sources are compared with each other (i.e. Cartesian product). A data partition method may be employed to reduce the calculation time. This partition method, performed prior to the matching steps, utilizes the property that based on some predefined fields the data can be partitioned in such a way that distance measures can be used to indicate what records of data source k needed to be matched with which records from data source 1. For example: the month in which the event occurred (data source 1) and the month in which the Service Orders were created (data source k) can be determined. Then only the records from the different data sources that belong to the same month (and year) are matched. The impact on the total calculation time depends on the number of partitions. In practice computing times may be reduced several orders of magnitude.

As described above, methods are provided that combine the different data sources while indicating the quality of the combination. This reduces the amount of work needed to match records. A measure of the usefulness of this approach is that without the methods described herein certain analysis takes a couple of weeks to perform. With the methods described herein the "manual" results can be reproduced and improved upon in a matter of hours.

Identifying Causal Relationships Using Transfer Entropy

Transfer entropy is a directional measure of asymmetrical information flow and is described in "Measuring Information Transfer" by Schreiber T. (*Physical Review Letters* 85 (2): 461-464), which is herein incorporated by reference. Transfer Entropy is a measure of the entropy difference between a future observation based solely on previous values for that observation (its own past), and a corresponding future observation based on previous values for that observation and previous values for another observation (its own past and the past of another observation). In other words, transfer entropy from a process X to another process Y is the amount of uncertainty reduced in future values of Y by knowing the past values of X given past values of Y.

In information theory, entropy (more specifically, Shannon entropy) is a measure of the expected value (average) of the information contained in each message (e.g. event or value within a time series or other data stream) received. More specifically, Shannon entropy $H(Y_t)$ describes the average number of bits needed to optimally encode independent draws of the discrete variable $Y_t$ following a probability distribution p(y):

$$H(Y_t) = -\sum_{y \in Y_t} p(y) \log p(y) \qquad \text{Equation (1)}$$

Transfer Entropy T can be described as:

$$T(X_t > Y_{t,\tau,k,l,\omega}) = \qquad \text{Equation (2)}$$
$$\sum_{y_t, y_{t-\omega\Delta t}^{[k]}, x_t^{[l]}} p(y_t, y_{t-\omega\Delta t}^{[k]}, x_{t-\tau\Delta t}^{[l]}) \log \frac{p(y_t \mid (y_{t-\omega\Delta t}^{[k]}, x_{t-\tau\Delta t}^{[l]}))}{p(y_t \mid y_{t-\omega\Delta t}^{[k]})}$$

where p(a,b) is the joint probability of events a and b occurring at the same time, and p(b|a) is the conditional probability which equals p(a,b)/p(a). $y_t^{[k]}$ and $x_t^{[l]}$ are the immediate history of time series $X_t$ and $Y_t$ of time interval k and l respectively. In the above the lag parameter ω accounts for the situation that the k length history of $Y_t$ that provides the most information about $Y_t$ may not be its immediate history at ω=1 but is located ω>1 time steps earlier (time steps are in units of Δt or dt). Similarly the time lag τ, allows consideration of l length history of $X_t$ at a distance t that provides additional information over and above what is contained in $Y_t$'s own history. T measures the reduction in the uncertainty of the current state of $Y_t$ which is gained from the l length history of $X_t$ that is not present in the k length history of $Y_t$ itself.

Assuming l=k=ω=1, and time lag τ is an unknown to be determined, then the equation for transfer entropy T can be simplified to:

$$T(X_t > Y_{t,\tau}) = \qquad \text{Equation (3)}$$
$$\sum_{y_t, y_{t-1}, x_{t-\tau}} p(y_t, y_{t-1}, x_{t-\tau}) \log \frac{p(y_t \mid (y_{t-1}, x_{t-\tau}))}{p(y_t \mid y_{t-1})}$$

In this recital, transfer entropy T is a measure of the information contributed to $y_t$ by $x_t$ across time lag τ additional to that contributed by $y_{t-1}$. By computing T across many time lags, it is possible to assess the time scale of directional coupling from $X_t$ to $Y_t$. Equation (7) can be written in an alternative form, in terms of component Shannon entropies H:

$$T(X_t > Y_t, \tau) = H(X_{t-\tau}, Y_{t-1}) + H(Y_t, Y_{t-1}) - H(Y_{t-1}) - H(X_{t-\tau}, Y_t, Y_{t-1}) \qquad \text{Equation (4)}$$

where (for example) H(X,Y) is the joint entropy between two parameters X and Y. It should be noted that other measures of entropy, in the information theory sense, can be used in determination of transfer entropy. The use of Shannon entropy is only an example.

To apply transfer entropy to lithographic apparatus events, such as those recorded the event log, the following decisions are made:

1. What constitutes an 'event'. This can be anything, for example, which is recorded in the event log, and/or may comprise: parameter values from sensors, measurements performed by the lithographic apparatus, measurements performed on lithographic apparatus produce. Such events should be recorded continuously or periodically so that a time series of events can be constructed for each parameter. In a specific example relevant to the method of FIG. 5, the time series may include one or more first (e.g., binary) extreme event time series indicating the presence or absence of an extreme event and one or more second (e.g., binary) failure event time series indicating the presence or absence of a failure event. Other embodiments may have a greater number of levels (or a continuous scale), in particular for the extreme event time series, which can capture the level of extremity of the extreme event.

2. How to discretize the observed time series from systems having continuous state spaces or, in order to reduce the number of possible states, further discretize natively discrete time series from systems having high-dimensional state spaces. Since the transfer entropy measure in Equation (3) is derived for discrete time series, discretization of observed time series may be a necessary step towards estimation of transfer entropy. Discretization can, for example, be performed by sorting the set of values of a time series from smallest to largest and equally partitioning the sorted set into a number of bins, each assigned a state. The estimation of transition probability is then straightforward to calculate from occurrence frequency.

3. What block length of past values should be applied for the source and target parameter.

Figure 11:
FIG. 11 is a flow diagram illustrating a method to construct a network of causal relations, according to an exemplary embodiment.

FIG. 11 is a flow diagram illustrating a method to construct a network of causal relations, usable in step 550 according to an exemplary embodiment. The steps are as follows, and are then described in greater detail thereafter (the order of some steps may be switched):

1110—Set of time series;
1120—Quantify causal relations between all pairs of subsystem parameters by measuring transfer entropy between their time series data;
1130—Test the statistical significance of the calculated transfer entropy values, using surrogate data and bootstrap methods;
1140—Compute synchronization ratio Tz;
1150—Identify characteristic time lag; and
1160—Construct the network.

1110 is a set of time series which may comprise extreme event time series (a transform of parameter data into an indication of the presence, absence and optionally the extremity of extreme events), and failure event time (a transform of parameter data into an indication of the presence, absence and optionally the extremity of failure events).

At 1120, a value for transfer entropy T can be calculated for all pairs of events detected/comprised within the time series (this should be in both directions, as transfer entropy is asymmetric). This may be performed for multiple time lags using Equation (2), Equation (3) or Equation (4), for example.

At step 1130, the statistical significance of each calculated transfer entropy value can be calculated. This is a test of whether an event relationship described by a transfer entropy value is stronger than that which would occur through random chance between unrelated time series and/or events. This can be done by comparing each transfer entropy value T to a significance threshold $T_s$. The significance threshold $T_s$ may be determined based on a shuffled surrogate transfer entropy. Where T describes the transfer entropy between time series $X_t$ and $Y_t$, the shuffled surrogate transfer entropy will be the transfer entropy of time series $X_s$ and $Y_s$, where time series $X_s$ and $Y_s$ are randomly shuffled (in time) versions of time series $X_t$ and $Y_t$, respectively. This shuffling destroys time correlations between the time series. Only if the transfer entropy value T is greater than significance threshold $T_s$, is it presumed that there is significant flow of information between the relevant parameters. Transfer entropy values that fall below the significance threshold $T_s$ cannot be considered statistically meaningful for the establishment of a significant coupling.

In an embodiment, shuffled surrogate transfer entropies are calculated for a number of realizations of shuffled time series $X_s$ and $Y_s$, resulting in a Gaussian distribution of surrogate transfer entropies. The significance threshold $T_s$ can then be based on the mean of this Gaussian distribution; for example it can be set at a number of standard deviations above the mean.

At step 1140, a synchronization ratio $T_z$ can be calculated, to help determine the reasons behind an observation that two parameters and/or events share a significant amount of information at a given time scale. The synchronization ratio $T_z$ may be a ratio of the calculated transfer entropy between the two events and a measure of shared information between the two events. Specifically, the synchronization ratio $T_z$ may be calculated by:

$$T_Z(X_t > Y_t, \tau) = \frac{T(X_t > Y_t, \tau)}{I(X_t, X_t)} \quad \text{Equation (5)}$$

where $I(X_t, Y_t)$ is the mutual information between $X_t, Y_t$. Mutual information is a measure of the events' mutual dependence; that is it measures how much knowing one of these events reduces uncertainty about the other. Mutual information can be defined as:

$$I(X_t, Y_t) = \sum p(x_t, y_t) \log \frac{p(x_t, y_t)}{p(x_t)p(y_t)} \quad \text{Equation (6)}$$

Synchronization ratio $T_z$ measures the transfer of information from $X_{t-\tau}$ to $Y_t$ as compared with the mutual information at zero lag. This ratio enables characterization of the nature of the coupling between the two events. It should be noted that the synchronization ratio $T_z$ is asymmetric, and therefore the coupling characteristics between pairs of events might be different in different directions.

Where there is coupling between pairs of events (in a particular direction), the coupling can be categorized as synchronization dominated, feedback dominated or forcing dominated. Synchronization dominated coupling can be defined as when $T_z<1$ and $T<T_s$. This coupling indicates significant shared information, but no significant information flow. Feedback dominated flow can be defined as when $T_z<1$ and $T>T_s$. This coupling indicates significant shared information greater than significant information flow. This is an intermediate categorization between synchronization coupling and forcing coupling, where substantial synchronization and forcing both exist. Forcing coupling can be defined when $T_z>1$ and $T>T_s$. This coupling indicates significant information flow greater than significant shared information.

At step 1150, the characteristic time lag for each identified coupling (each transfer entropy value) can be calculated. This can be the first statistically significant time lag, or else the time lag for which the transfer entropy T is highest (assuming it is statistically significant).

At step 1160, given a number of events, it is possible to construct a process network by casting each event (extreme event or failure event) as a node in the network and computing the transfer entropy between each node. Edges (in each direction) can be shown between nodes where statistically significant coupling has been shown to exist. The process network can also indicate the coupling strength (value of the transfer entropy) and the coupling characterization. A causal matrix may be constructed, where each cell indicates whether there is a directional coupling between two nodes. The causal matrix may be a three dimensional matrix $[n_p \times n_p \times n_\tau]$, where $n_p$ is the number of events and $n_\tau$ is the number of time lags studied. However, to keep the calculations more manageable, a two dimensional matrix $[n_p \times n_p]$ can be used, comprising values of transfer entropy for each entry which corresponds to the characteristic time lag for that coupling, as determined in the previous step.

The causal matrix may be displayed, for example, as a circular directional chart (nodes and connections), a bubble chart and/or a heat map. In a bubble chart or a heat map, the causal strength (transfer entropy value) may be represented by the bubble diameter or color respectively.

Once the process network is constructed, it may be beneficial to identify the nodes which have more than one in- or out-links. These nodes may have the largest impact on the network. A network centrality analysis may be performed to rank the network nodes in terms of impact. The ranking can then be used to map information flows from fault to failure within the system. By way of example, the rankings can be applied to the entries in the aforementioned event log, enabling indication of the most influential of subsystem reported root errors, in a directed causal graph with normal events, warnings, failure events and alarms.

In summary, as a result of using transfer entropy methods as described to monitor lithographic apparatuses, interactions between scanner observables may be viewed as transfers of information. Transfer entropy enables causation analysis on every pair of simultaneously observed lithographic apparatus time series. Transfer entropy enables reconstruction of causal relationships between events, warnings, errors and alarms as opposed to exception-linking between errors and alarms only. From the causal relationships, fault to failure paths can be determined and the root cause of a fault better identified.

Methods of Managing Alerts

When an alert is generated, it is assumed that that it will be promptly acted upon, such that engineers define and plan actions for all alerts. While this would be an ideal situation, the reality is that engineer time and resource is finite, and the modelling of complex machines such as lithographic apparatuses may generate too large a number of alerts for them to be all attended to promptly. As a result, it may be the case that engineers make a selection of the alerts to follow up on (in accordance, for example, with their expertise as to which alerts are the most important and/or time critical). This will result in the alerts which have not been selected for attention, to be left unattended but still active.

Therefore, based on the alert and corresponding benefit metric, a management action may be performed, for example an alert expiry time can be calculated for some or all of the alerts. This alert expiry time can be automatically applied to the alerts, or otherwise monitored, and unattended alerts can be cancelled/reset once the alert expiry time is reached. In this way, unattended alerts will expire when the business impact (or other criteria) becomes too low for it to be worth attending to them. Of course, not all alerts need be assigned an alert expiry time; some alerts may be determined as critical and should remain active till attended to (or, to the same effect, may be assigned an alert expiry time of infinity).

In a specific example, the benefit matric may be derived from underlying failure probabilities, which may be approximated by way of a Weibull approximation. The Weibull approximation may construct the underlying failure probability as function of the days since the alert. When a model is backend tested, a cumulative distribution function may be used. The cumulative distribution function can be interpreted as the fraction of failures after time x since the alert. From this, one backend test result which can be used in this method is the remaining useful life (RUL), defined as being the time at which 80% of items/systems corresponding to the alert have failed after generation of the alert.

The alert expiry time $t_{stop}$ may be defined as the time after which, on average, the benefits do not outweigh the cost anymore, and under the condition of a Weibull distribution may be given by:

$$t_{stop} = RUL * \ln(5)^{-\frac{1}{\beta}} * \left( \ln\left( \frac{B}{c} * \frac{\text{precision}}{1 - \text{precision}} \right) \right)^{\frac{1}{\beta}} \quad \text{Equation (7)}$$

where β is the so-called shape factor of the Weibull appropriate for the model, B is a benefit metric of a proactive action, C is a cost metric of an alert validation, Precision is the standard deviation of the estimator and RUL the time after which 80% of the failures have occurred in a cumulative failure probability distribution function.

Figure 12:
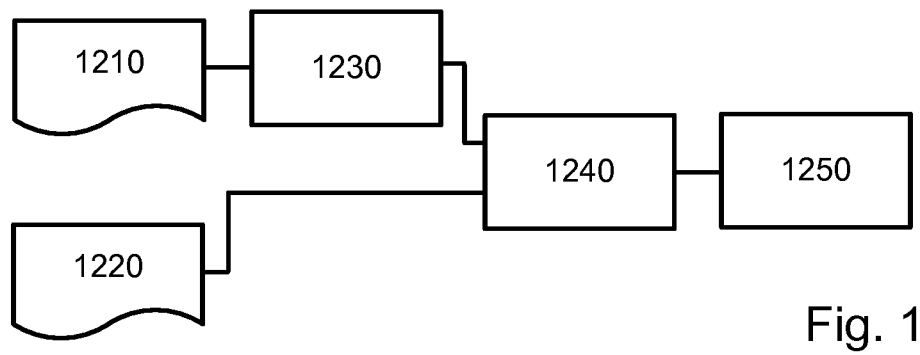
FIG. 12 is a flow diagram illustrating a method to assign alert expiry times, according to an exemplary embodiment.

FIG. 12 is a flow diagram illustrating a method to assign alert expiry times, which may be used in steps 560 and 590 according to an exemplary embodiment. The steps are as follows, and are then described in greater detail thereafter (the order of some steps may be switched):

1210—Backend test results;
1220—Business information;
1230—Determine probability Distributions;
1240—Determine alert expiry time; and
1250—Monitor expiry times.

1230—Backend test results 1210 are used to determine a benefit metric for each possible alert. Such a benefit metric may comprise or be derived from a failure (or other event) probability distribution over time following an alert. The probability distributions describe the probability of a failure occurring after an alert as a function of time. Such a probability distribution may comprise a cumulative or non-cumulative probability that a failure will occur over the time since alert. For example, such a probability may be approximated using a Weibull approximation. In an embodiment, the benefit metric is a measure of the downtime reduction potential for certain failure scenarios derived from the failure probability distribution. This step may be used in the automated model qualification in step 560 of FIG. 5.

1240—The benefit metric determined in step 1230 and a cost metric obtained from business information 1220 are used to determine an alert expiry time for each alert. The alert expiry time may be calculated using Equation (7). The business information 1220 may include the costs of certain alert attendance scenarios (e.g. maintenance and/or repair actions appropriate for a particular alert). Such a cost metric may take into account any cost or overhead in attending to an alert, and may include, for example, machine downtime, reduced productivity, financial cost and resource utilization (person and/or machine). The alert expiry time can be obtained from an evaluation the benefit against cost in attending to an alert as a function of time. The alert expiry time can be determined based on whether the evaluation of benefit against cost meets or passes a threshold. The threshold may be defined as the point at which it is determined that the benefit against cost is negative, and therefore the costs outweigh the benefit.

A step 1250, the alert information is displayed. When an alert expiry time is reached for an alert, the representation of that alert may be changed in some way. It may be that an alert is automatically reset at the alert expiry time, or else the alert may be displayed as being expired. This displaying of the alerts may be performed as part of a front end process, while the other steps of the method may be performed as a back end process which may or may not be part of the front end.

As previously described, there are too many alerts generated than can be attended to promptly. From a business perspective, alerts generated have a varying impact. This impact depends on the time for which an alert remains unattended since the alert was generated. This implies that the priority of the alert will be time variable. Determination of priority at present is a human (user) decision process. However, the priority of a pending alert, relative to the other pending alerts, can change quickly and may therefore be onerous to maintain accurately.

In another embodiment, the business information and associated cost metric, and the benefit metric obtained from or comprising the probability distributions (obtained in turn from backend test results) for each predictive model can be used to determine a priority metric for each alert. The priority metric will be time dependent and therefore relative rankings of unattended alerts may vary over time. The method may comprise determining a priority metric for each alert which is a measure of the instantaneous impact of the alerts. A reference model and corresponding reference priority metric is then identified; this may be the model having the highest priority metric (and therefore highest instantaneous impact value for an intervention) at the time the impact is generated. The priority metric may be defined on a logarithmic scale, such that alerts may be ranked, for example, from 1 to 5 or 1 to 10, with each ranking representing an order of magnitude greater intervention benefit impact than a previous ranking, relative to the reference priority metric. The alerts can then be given a priority ranking based on the priority metric values at a given time.

Figure 13:
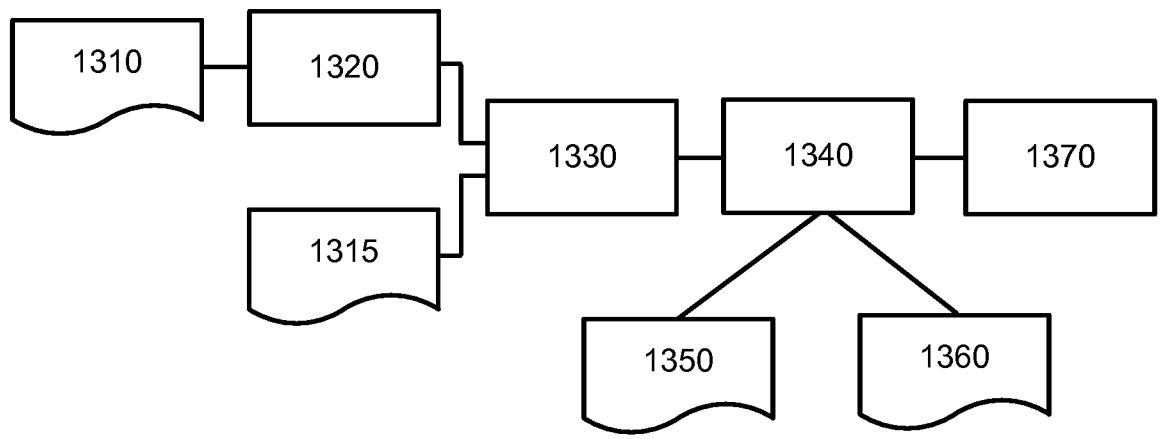
FIG. 13 is a flow diagram illustrating a method to prioritize alerts, according to an exemplary embodiment.

FIG. 13 is a flow diagram illustrating a method to prioritize alerts, which may be used in steps 560 and 590 according to an exemplary embodiment. The steps are as follows, and are then described in greater detail thereafter (the order of some steps may be switched):

1310—Backend test results;
1315—Business information;
1320—Determine probability distributions;
1330—Determine instantaneous impact of intervention (priority metric);
1340—Cast relative instantaneous impact on a logarithmic scale;
1350—Reference priority metric at t=0;
1360—Priority scale and direction, logarithm base; and
1370—Display priority ranking.

At step 1320, as in the previous embodiment, Backend test results are used to determine a benefit metric. As before the benefit metric may comprise or be derived from failure (or other event) probability distributions over time following an alert. This is essentially the same step as 1230.

At step 1330, a priority metric is determined for each alert. The priority metric is a measure of the instantaneous impact of an intervention or follow up action to an alert being generated. The priority metric is determined using the probability distributions from the previous step and business information. As with the previous embodiment, business information may come in the form of, or allow the generation of, a cost metric for any intervention. The business information will also include a measure of the instantaneous impact of an intervention at time t=0, that is at the moment that the alert is generated. Using this information, and the benefit metric (probability distributions), a measure of the instantaneous impact of an intervention at t>0 can be determined.

In an embodiment, the priority metric takes the form of the expected instantaneous impact EII. EII is a measure of the impact of a proactive action, assuming immediate proactive action after time "x", multiplied by the probability of instantaneous failure after time "x". This may specifically take the form:

$$EII = \frac{A}{RUL^\beta} * \frac{\text{precision}\left(e^{-\left(\frac{t}{\tau}\right)^\beta} * B + C\right) - C}{1 + \text{precision} * \left(e^{-\left(\frac{t}{\tau}\right)^\beta} - 1\right)} \qquad \text{Equation (8)}$$

where t is time since alert in days and A is a constant.

At step 1340, the priority metrics are cast on a logarithmic scale relative to a reference priority metric. The reference priority metric may be the priority metric determined to have the greatest instantaneous impact value (priority=1) at time t=0 850. This can be derived from the business information. The priority metrics of the other alerts are then compared to the reference priority metric for the present time or other time t>0. By taking the logarithm (of any base) of the priority metrics, a priority ranking can be calculated for the alerts.

This may be achieved by mapping the expected instantaneous impact EII on a linear scale from 0 to N, with N being the lowest impact and 1 the highest (and 0 being extraordinarily high). When taking the logarithm of the priority metrics, the following three conditions should be met:
 The lower the priority metric, the higher the actual priority;
 When the EII is zero, the priority is N+1 (lower than the lowest priority);
 The priority of the reference priority metric is set to 1.

This results in the following exemplary formula for calculating a priority ranking Priority (t):

$$\text{Priority}(t) = \left\lceil N + 1 - \frac{\ln EII}{PS} \right\rceil \qquad \text{Equation (9)}$$

where the brackets indicate that the result is rounded up and PS is the reference priority metric having priority 1 at t=0, defined as:

$$PS = \frac{\ln\left(\frac{1}{RUL^\beta} * (\text{precision} * (B + C) - C) + 1\right)}{N}$$

At step 1370, the (unattended) alerts are displayed according to their priority ranking for the appropriate time (which may be the instant time). The priority metrics and the priority ranking may be recalculated at regular intervals, for example on a daily basis, half-daily basis or (multi or singular) hourly basis. Changes in relative priority metrics for each unattended alert will result in a specified change in the alert representation. The displaying of the priority rankings may be performed as part of a front end process, while the other steps of the method may be performed as a back end process which may or may not be part of the front end.

In a specific example where N=10, priority rankings of 0, 1 or 2 indicate a very high priority and the corresponding alerts may be represented as such (e.g., by being colored red). Similarly, alerts corresponding having a priority ranking between 3-7 may be represented as medium urgency (e.g., colored orange or yellow) and alerts having a priority ranking 8, 9 or 10 may be represented as low urgency (e.g., colored yellow or green). If the priority ranking is greater than 11, the alert may simply be expired.

The methods for prioritizing alerts and for determining alert expiry times can be combined, such that each alert is provided with both a priority ranking and an alert expiry time. Note however, that alerts having a priority of N+1 or greater can simply be removed and no alert expiry time need be generated.

Root Cause Determination via Directed Cycles

Present fault diagnostic methods have an important limitation in that they are each essentially non-deterministic because they are not capable of distinguishing between a limited set of potential root causes. An additional problem with the hybrid method of fault diagnostics is that in a volatile ecosystem, constant "tuning" of the fault diagnostics model is required. Every time the configuration changes, the directed graph used changes: whether it be the content of the nodes, the transfer probabilities, direction of causation etc.

The determination as to whether a directed cycle, or a node, is wanted or unwanted can be performed in a number of ways. However, the determination should be such that it can be automated. For example, a determination may be made based on the health characteristics represented by the node or directed cycle. For example, extreme event nodes may be unwanted as they may indicate a parameter falling out of specification, as are (almost certainly) failure event nodes. An unwanted directed cycle may comprise a directed cycle comprising one or more unwanted nodes, or which describe an unwanted reinforcing or feedback mechanism. Depending on the scope and context, other methods for a posteriori determining whether a node/cycle is unwanted could be applied. Also, the determination need not be binary, but instead may be continuous or have a greater resolution, depending on the scope and goal.

In an embodiment, whether a directed cycle or node is wanted or unwanted can be represented on the graph in a number of ways, for example by being represented in different colors.

Figure 14:
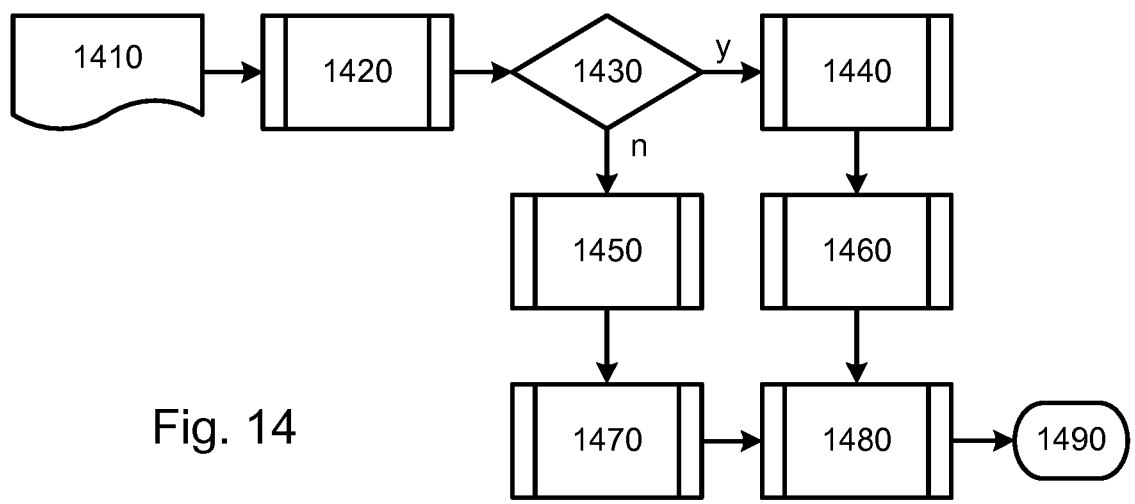
FIG. 14 is a flow diagram illustrating a method of performing model free, configuration independent fault diagnostics according to an exemplary embodiment.

FIG. 14 is a flow diagram illustrating a method of performing model free, configuration independent fault diagnostics according to an exemplary embodiment. The steps are as follows, and are then described in greater detail thereafter:

1410—Causal network
1420—Identify cycles
1430—Cycles found?
1440—Classify cycles/nodes
1450—Classify nodes
1460—Determine most important node leading to unwanted cycle/part of unwanted cycle
1470—Determine most important node/first node
1480—Determine root cause
1490—End At step 1420 the causal network (a directed graph) 1410 is examined to identify any directed cycles. At step 1430 a determination is made as to whether any directed cycles are present. If directed cycles are present, the directed cycles (and the nodes) are classified at step 1440. This may comprise determining whether the directed cycles and nodes are wanted or unwanted. Non-binary categorization is also possible (e.g., an indication of the degree by which a directed cycle is wanted/unwanted). On the causal network, wanted and unwanted cycles/nodes may be represented differently, e.g., by different colors. At 1460, the unwanted node (or where there are more than one, the most important unwanted node), which is connected to (e.g., leading into), but not part of, an unwanted directed cycle is identified. If there is no such unwanted node, then the most important unwanted node forming part of the unwanted directed cycle is identified. At step 1480, the identified node is determined to be the root cause node.

If at step 1430, it is determined that no directed cycles are present, then the nodes are classified at step 1450. This may comprise determining whether the nodes are wanted or unwanted. Non-binary categorization is also possible (e.g., an indication of the degree by which a node is wanted/unwanted). On the causal network, wanted and unwanted nodes may be represented differently, e.g., by different colors. At step 1470, the most important unwanted node, or alternatively the first unwanted node is identified and at step 1480, this identified node is determined to be the root cause node.

Further embodiments of the invention are summarized in below numbered embodiments:

1. A method for determining a causal relationship between events in a plurality of parameter time series associated with an industrial process, the method comprising: identifying at least a first event associated with a parameter excursion event; identifying at least a second event associated with a failure event; and establishing the causal relationship between the first event and the second event.

2. A method according to embodiment 1, wherein a parameter excursion event is identified as one or more of: a spike, a step, a change in trend, a change in standard deviation, a change in standard deviation relative to trend and a control limit violation in the corresponding parameter time series.

3. A method according to embodiment 1 or 2, wherein said parameter time series comprises one or more binary parameter excursion event time series indicative of the presence or absence of a parameter excursion event over time.

4. A method according to any preceding embodiment, wherein said parameter time series comprises one or more parameter excursion event time series indicative of the presence or absence of a parameter excursion event and the degree of extremity of any parameter excursion events, over time.

5. A method according to any preceding embodiment, wherein a failure event is identified as any failure of any aspect of said industrial process and/or any apparatus used in performing said industrial process.

6. A method according to any preceding embodiment, wherein said parameter time series comprises one or more binary failure event time series indicative of the presence or absence of a failure event over time.

7. A method according to any preceding embodiment, wherein the step of establishing the causal relationship comprises: determining a value for transfer entropy between said first event and second event; and using said value for transfer entropy to establish the causal relationship between the first event and second event.

8. A method according to embodiment 7, wherein said value for transfer entropy is determined and said causal relationship established for the first event and second event in both directions.

9. A method according to embodiment 7 or 8, wherein said value for transfer entropy is determined for the first event and second event, for a plurality of different time lags, wherein time lag is a measure of the time interval over which the transfer entropy is measured.

10. A method according to any of embodiments 7 to 9, wherein a statistical significance of the transfer entropy value is evaluated by comparing the determined transfer entropy value to a significance threshold value indicative of that which would occur through random chance; and attributing a causal relationship only when the transfer entropy value is above the significance threshold value.

11. A method according to embodiment 10, comprising shuffling the parameter time series in time, determining surrogate transfer entropy values for pairs of the shuffled time series and using the surrogate transfer entropy values as references in determining said significance threshold value.

12. A method according to any of embodiments 7 to 11, comprising:
determining a synchronization ratio for the determined transfer entropy value, said synchronization ratio being the ratio of the transfer entropy value to a mutual information value for corresponding pairs of the parameter time series; and
categorizing the established causal relationship using said synchronization ratio.

13. A method according to embodiment 12, wherein, where the transfer entropy value is evaluated as being statistically significant, the corresponding causal relationship is considered to represent a feedback dominated information flow if synchronization ratio is less than 1 and a forcing dominated information flow if synchronization ratio is greater than 1.

14. A method according to any of embodiments 7 to 13, wherein there are a plurality of events comprising said first events and second events; said method being performed for pairs of said events to determine a transfer entropy and establish a causal relationship for each of said pairs of events.

15. A method according to embodiment 14, comprising using said determined transfer entropies and identified causal relationships to determine a process network, wherein each of said events is a node in said process network, the edges between nodes being dependent upon the determined transfer entropies.

16. A method according to embodiment 15, wherein each edge comprises a corresponding time duration value representing the time duration between the events represented by the nodes the edge connects.

17. A method according to embodiment 16, wherein each edge further comprises information relating to direction of the causal relationship and transition probability between the nodes it connects.

18. A method according to any of embodiments 15 to 17, comprising determining a causal matrix wherein each cell of the causal matrix indicates whether there is a directional causal relationship between two nodes.

19. A method according to embodiment 18 wherein a characteristic time lag is determined for each pair of events, in each direction, to reduce dimensionality of said causal matrix.

20. A method according to embodiment 19 wherein said characteristic time lag is a first time lag for which the corresponding determined transfer entropy is evaluated to be statistically significant.

21. A method according to embodiment 19 wherein said characteristic time lag is the time lag for which the corresponding determined transfer entropy is highest.

22. A method according to any of embodiments 15 to 21, wherein all nodes of said process network represent exclusively either a parameter excursion event or a failure event.

23. A method according to embodiment 22, wherein each subsection of the process network which comprises a node representing a parameter excursion event leading to a node representing a failure event is determined to be a predictive model.

24. A method according to embodiment 23, comprising performing backend testing for each predictive model; and using the backend testing results to qualify each determined predictive model.

25. A method according to embodiment 24, wherein said backend testing comprises obtaining comparing the results of predictions of the predictive model to corresponding known history of a system and/or process modelled by the model.

26. A method according to embodiment 24 or 25, wherein the qualification of each determined predictive model is performed in terms of one or more of: sensitivity, precision, causal delays.

27. A method according to embodiment 24, 25 or 26, comprising using the backend testing results to determine a benefit metric relating to a measure of a benefit in attending to a parameter excursion event comprised in a predictive model; and using said benefit metric to qualify said predictive model.

28. A method according to embodiment 27, wherein the benefit metric is obtained from a failure probability distribution describing the probability of failure over time during which a parameter excursion event is not attended to.

29. A method according to any of embodiments 23 to 28 comprising managing unattended alerts generated by one or more of the predictive models based on detection of one or more parameter excursion events, by:
obtaining a cost metric relating to a measure of a cost of attending to each alert generated; obtaining a benefit metric relating to a measure of a benefit in attending to each alert generated as a function of time; and
performing a management action on said unattended alerts based on an evaluation of the benefit metric against the cost metric for each alert.

30. A method according to embodiment 29 wherein said management action comprises assigning an alert expiry time to each of said unattended alerts based upon the evaluation of the benefit metric against the cost metric appropriate for each alert.

31. A method according to embodiment 30 wherein the alert expiry time is based on a time for which evaluation of the benefit metric against the cost metric meets a threshold value.

32. A method according to any of embodiments 29 to 31 comprising automatically expiring unattended alerts at their alert expiry time.

33. A method according to any of embodiments 29 to 32 wherein the alert expiry times are displayed to a user.

34. A method according to any of embodiments 29 to 33 wherein said management action comprises determining a priority metric for each of said unattended alerts based upon the evaluation of the benefit metric against the cost metric appropriate for each alert, said priority metric being a measure of the instantaneous impact of attention to each unattended alert.

35. A method according to embodiment 34 wherein said priority metrics are referenced relative to a reference priority metric, said reference priority metric being the priority metric determined to represent the greatest instantaneous impact at the time the corresponding alert is generated.

36. A method according to embodiment 34 or 35 wherein the measure of the instantaneous impact of attention to each unattended alert comprises a measure of the impact of a proactive action assuming an immediate proactive action after a particular time multiplied by the probability of instantaneous failure after said particular time.

37. A method according to embodiment 34, 35 or 36 wherein a priority ranking assigned to each alert based upon its priority metric.

38. A method according to embodiment 37 wherein the priority rankings and/or the priority metrics are displayed to a user.

39. A method according to any of embodiments 29 to 38, wherein the cost metric is derived from known information relating to the costs of attending to each alert.

40. A method according to any of embodiments 15 to 39, further comprising the steps of:
identifying one or more directed cycles within said plurality of events and said causal relationships;
classifying a directed cycle based on a nominal system behavior; and
classifying one or more event(s) having a causal relation to the classified directed cycle based on the cycle classification.

41. A method according to embodiment 40 wherein said step of classifying one or more event(s) comprises classifying one or more of said first events as a root cause event for one of said second events.

42. A method according to embodiment 41 wherein said step of classifying one or more of said first events as a root cause event comprises classifying one or more of said first events which have a causal relationship with a classified directed cycle, but which are not comprised within the classified directed cycle, as a root cause event.

43. A method according to embodiment 41 or 42 wherein said step of classifying a directed cycle comprises determining whether said directed cycle is wanted or unwanted.

44. A method according to embodiment 43 wherein determining whether said directed cycle is wanted or unwanted comprises determining whether an aspect of operation of the system described by the directed cycle is within a specified margin with reference to said nominal system behavior.

45. A method according to embodiment 43 or 44 comprising determining said root cause event as a first event having a causal relationship with a classified unwanted directed cycle, but not comprised within the classified unwanted directed cycle.

46. A method according to any of embodiments 15 to 45, comprising identifying one or more failure paths from a parameter excursion event to a failure event.

47. A method according to embodiment 46, wherein one of said failure paths comprises a plurality of parameter excursion events, validating an the occurrence of an earlier parameter excursion event on said failure path with a subsequent parameter excursion event on said failure path.

48. A method according to embodiment 46 or 47, comprising determining different failure paths to a single failure event, said different failure paths differing in terms of one or more parameter excursion events leading to said single failure event.

49. A method according to any preceding embodiment, wherein said method comprises the initial step of determining context data relating to a context in which the industrial process is operating from said parameter time series, wherein said process is operable in at least one of a plurality of contexts at any one time; and
applying a quality weighting to said context data, said quality weighting being dependent upon a measure of the accuracy of said context data for a particular context segment, each context segment comprising a segment of one of said contexts, wherein each context is segmented temporally.

50. A method according to embodiment 49 wherein said measure of the accuracy of said context data for a particular context segment has been previously determined for each possible context segment for the system and/or process.

51. A method according to embodiment 50 wherein said measure of the accuracy of said context data for a particular context segment has additionally been previously determined for each possible context transition, for each of said possible context segments.

52. A method according to any of embodiments 49 to 51 wherein said context segments comprise intermediate segments and transitional segments, such that each context comprises two transitional segments and an intermediate segment therebetween.

53. A method according to any of embodiments 49 to 52 wherein said quality weighting is applied to each context segment of said context data in dependence upon the context segment.

54. A method according to embodiment 53 wherein said quality weighting is applied to each context segment of said context data in further dependence of the preceding and/or succeeding context segment.

55. A method according to any of embodiments 49 to 54 wherein the quality weighting determines the degree of consideration accorded to said context data and/or an event to which the context data corresponds when determining said causal relationship between events.

56. A method according to embodiment 55 wherein the quality weighting is binary such that said context data and/or the event to which the context data corresponds is weighted to be either included or not included in determining said causal relationship between events.

57. A method according to any of embodiments 49 to 56 wherein said context comprises an operational mode or operational state of the system and/or process.

58. A method according to any preceding embodiment, comprising determining the time of one or more of said parameter excursion events by performing, for the parameter time series comprising the parameter excursion event:
applying a causal filter to said parameter time series to obtain first filtered time series data;
applying an anti-causal filter to said parameter time series obtain second filtered time series data and combining said first filtered time series data and said second filtered time series data to determine a corrected time for the parameter excursion event.

59. A method according to embodiment 58, wherein the step of applying an anti-causal filter comprises:
reversing the parameter time series in time; and
applying said causal filter to the reversed parameter time series.

60. A method according to embodiment 58 or 59, comprising the initial step of determining a signal envelope of input parameter data such that said parameter time series describes said signal envelope.

61. A method according to embodiment 60, wherein the step of determining a signal envelope comprises determining an upper envelope and a lower envelope, said method being performed separately for each of said upper envelope and lower envelope.

62. A method according to any of embodiments 58 to 61, comprising:
determining a first time for said parameter excursion event within the first filtered time series data; and
determining a second time for said parameter excursion event within the second filtered time series data;
wherein said combining step comprises combining said first time and said second time to obtain said corrected time.

63. A method according to any preceding embodiment, wherein said plurality of parameter time series comprises parameter excursion time series comprising one or more of said parameter excursion events and failure parameter time series comprising one or more of said failure events wherein said parameter excursion time series and failure time series having variation between them in matching quality of their data, said method further comprising:
repeatedly matching and filtering events from each of the parameter excursion time series and failure time series to obtain matched events using successively less strict matching rules, the matching rules being defined based on the variation in the matching quality.

64. The method according to embodiment 63, further comprising associating the matched events with a matching quality indicator corresponding to the strictness of the matching rule used to obtain them.

65. The method according to embodiment 63 or 64, wherein the variation in matching quality comprises a difference in timing accuracy of the events.

66. The method according to any of embodiments 63 to 65, wherein the matching rules are defined based on a distance measure between said parameter excursion events and failure events, the distance measure comprising a difference in accuracy between the different parameter time series.

67. The method according to embodiment 66, wherein the matching rules are defined based on a weighted sum of the distance measure.

68. The method according to any of embodiments 63 to 67, further comprising the steps of:

(a) selecting a set of events from the plurality of parameter time series;
(b) defining one or more distance measures between the events; and
(c) defining a set of matching rules with differing strictness based on the defined distance measures, and wherein repeatedly matching and filtering events from the parameter time series comprises the steps of:
(d) querying the parameter time series using the strictest of the set of matching rules and associating matched events thereby obtained with an indicator indicating the high matching quality; and
(e) querying the parameter time series using a less strict rule of the set of matching rules and associating matched events thereby obtained with an indicator indicating a lower matching quality.

69. A method according to any preceding embodiment, wherein said industrial process comprises a lithographic process for applying a pattern on a substrate.

70. A lithographic apparatus comprising:
an illumination optical system arranged to illuminate a pattern; and
a projection optical system arranged to project an image of the pattern onto a substrate;
wherein the lithographic apparatus is arranged to perform the method of embodiment 69 to model operation of said lithographic process performed by said lithographic apparatus.

71. A computer program comprising processor readable instructions which, when run on suitable processor controlled apparatus, cause the processor controlled apparatus to perform the method of any of embodiments 1 to 69.

72. A computer program carrier comprising the computer program of embodiment 71.

73. A method of manufacturing devices wherein a device pattern is applied to a series of substrates using a lithographic process, the method including modelling operation of said lithographic process using the method of embodiment 69.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:
identifying at least a first event associated with a parameter excursion event;
identifying at least a second event associated with a failure event, wherein there are a plurality of events in a plurality of parameter time series associated with an industrial process, the plurality of events comprising a plurality of the first events and second events;
determining values of transfer entropy for pairs of the events to establish a causal relationship for each of the pairs of events;
using the determined values of transfer entropy and identified causal relationships to determine a process network, wherein each of the events is a node in the process network, the edges between nodes being dependent upon the determined values of transfer entropy;
identifying one or more directed cycles within the plurality of events and the causal relationships;
classifying a directed cycle of the one or more directed cycles, based on a nominal system behavior; and
classifying one or more events having a causal relation to the classified directed cycle based on the cycle classification.

2. The method as claimed in claim 1, wherein the classifying one or more events comprises classifying one or more of the first events as a root cause event for one of the second events.

3. The method as claimed in claim 1, wherein a parameter excursion event is identified as one or more selected from: a spike, a step, a change in trend, a change in standard deviation, a change in standard deviation relative to trend, and/or a control limit violation in the corresponding parameter time series.

4. The method as claimed in claim 1, wherein each subsection of the process network which comprises a node representing a parameter excursion event leading to a node representing a failure event is determined to be a predictive model.

5. The method as claimed in claim 4, further comprising managing unattended alerts generated by one or more of the predictive models based on detection of one or more parameter excursion events, by:
obtaining a cost metric relating to a measure of a cost of attending to each alert generated;
obtaining a benefit metric relating to a measure of a benefit in attending to each alert generated as a function of time; and
performing a management action on the unattended alerts based on an evaluation of the benefit metric against the cost metric for each alert.

6. The method as claimed in claim 1, further comprising identifying one or more failure paths from a parameter excursion event to a failure event.

7. The method as claimed in claim 6, wherein one of the failure paths comprises a plurality of parameter excursion events, and further comprising validating an occurrence of an earlier parameter excursion event on the failure path with a subsequent parameter excursion event on the failure path.

8. The method as claimed in claim 1, further comprising:
an initial step of determining context data relating to a context in which the industrial process is operating from the parameter time series, wherein the process is operable in at least one of a plurality of contexts at any one time; and applying a quality weighting to the context data, the quality weighting being dependent upon a measure of the accuracy of the context data for a particular context segment, each context segment comprising a segment of one of the contexts, wherein each context is segmented temporally.

9. The method according to claim 8, wherein the quality weighting is applied to each context segment of the context data in further dependence of the preceding and/or succeeding context segment.

10. The method according to claim 8, wherein the quality weighting determines the degree of consideration accorded to the context data and/or an event to which the context data corresponds when determining the causal relationship between events.

11. The method according to claim 10, wherein the quality weighting is binary such that the context data and/or the event to which the context data corresponds is weighted to be either included or not included in determining the causal relationship between events.

12. The method according to claim 8, wherein the context comprises an operational mode or operational state of the system and/or process.

13. The method as claimed in claim 1, further comprising determining the time of one or more of the parameter excursion events by, for the parameter time series comprising the parameter excursion event;
applying a causal filter to the parameter time series to obtain first filtered time series data;
applying an anti-causal filter to the parameter time series to obtain second filtered time series data; and
combining the first filtered time series data and the second filtered time series data to determine a corrected time for the parameter excursion event.

14. The method as claimed in claim 1, wherein the plurality of parameter time series comprises parameter excursion time series comprising one or more of the parameter excursion events and failure parameter time series comprising one or more of the failure events, wherein the parameter excursion time series and failure time series having variation between them in matching quality of their data, and the method further comprises repeatedly matching and filtering events from each of the parameter excursion time series and failure time series to obtain matched events using successively less strict matching rules, the matching rules being defined based on the variation in the matching quality.

15. The method as claimed in claim 1, wherein the industrial process comprises a lithographic process for applying a pattern on a substrate.

16. A non-transitory computer-readable medium comprising instructions stored therein, the instructions, upon execution by a computer system, configured to cause the computer system to at least:
identify at least a first event associated with a parameter excursion event;
identify at least a second event associated with a failure event, wherein there are a plurality of events in a plurality of parameter time series associated with an industrial process, the plurality of events comprising the first event and second event;
determine values of transfer entropy for pairs of the events to establish a causal relationship for each of the pairs of events;
use the determined values of transfer entropy and identified causal relationships to determine a process network, wherein each of the events is a node in the process network, the edges between nodes being dependent upon the determined values of transfer entropy;
identify one or more directed cycles within the plurality of events and the causal relationships;
classify a directed cycle of the one or more directed cycles, based on a nominal system behavior; and
classify one or more events having a causal relation to the classified directed cycle based on the cycle classification.

17. The computer-readable medium as claimed in claim 16, wherein the classification of one or more events comprises classification of one or more of the first events as a root cause event for one of the second events.

18. The computer-readable medium as claimed in claim 16, wherein a parameter excursion event is identified as one or more selected from: a spike, a step, a change in trend, a change in standard deviation, a change in standard deviation relative to trend, and/or a control limit violation in the corresponding parameter time series.

19. The computer-readable medium as claimed in claim 16, wherein each subsection of the process network which comprises a node representing a parameter excursion event leading to a node representing a failure event is determined to be a predictive model.

20. A lithographic apparatus comprising:
an illumination optical system arranged to illuminate a pattern;
a projection optical system arranged to project an image of the pattern onto a substrate; and
the non-transitory computer-readable medium of claim 16, wherein the plurality of events pertain to operation of a lithographic process by the lithographic apparatus.

* * * * *